United States Patent
Manfrini et al.

(10) Patent No.: US 11,211,426 B2
(45) Date of Patent: Dec. 28, 2021

(54) TUNNEL JUNCTION SELECTOR MRAM

(71) Applicant: Taiwan Semiconductor Manufacturing Company, Ltd., Hsinchu (TW)

(72) Inventors: Mauricio Manfrini, Zhubei (TW); Hon-Sum Philip Wong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 107 days.

(21) Appl. No.: 16/589,255

(22) Filed: Oct. 1, 2019

(65) Prior Publication Data

US 2021/0098530 A1   Apr. 1, 2021

(51) Int. Cl.
*H01L 27/22* (2006.01)
*H01L 43/12* (2006.01)
*H01L 43/02* (2006.01)

(52) U.S. Cl.
CPC ............ *H01L 27/226* (2013.01); *H01L 43/02* (2013.01); *H01L 43/12* (2013.01)

(58) Field of Classification Search
CPC ........ H01L 27/226; H01L 43/12; H01L 43/02
See application file for complete search history.

(56) References Cited

U.S. PATENT DOCUMENTS

| | | | |
|---|---|---|---|
| 9,647,200 B1* | 5/2017 | Annunziata | ........... G11C 11/161 |
| 10,134,457 B1* | 11/2018 | Mihajlovic | ......... G11C 11/1675 |
| 2015/0137062 A1 | 5/2015 | Ananthan et al. | |
| 2015/0179934 A1 | 6/2015 | Mathur et al. | |
| 2015/0263069 A1 | 9/2015 | Jo | |
| 2016/0043142 A1 | 2/2016 | Hong et al. | |
| 2017/0117027 A1 | 4/2017 | Braganca et al. | |
| 2018/0261270 A1 | 9/2018 | Yoshikawa et al. | |
| 2018/0358557 A1 | 12/2018 | Jung | |

FOREIGN PATENT DOCUMENTS

| | | |
|---|---|---|
| EP | 1604390 B1 | 4/2010 |
| JP | 2017112359 A | 6/2017 |
| KR | 20140116264 A | 10/2014 |
| KR | 20160132444 A | 11/2016 |
| TW | 201834283 A | 9/2018 |
| WO | 2015138119 A1 | 9/2015 |
| WO | 2019182591 A1 | 9/2019 |

* cited by examiner

*Primary Examiner* — Karen Kusumakar
*Assistant Examiner* — Adam S Bowen
(74) *Attorney, Agent, or Firm* — Slater Matsil, LLP

(57) ABSTRACT

A magnetoresistive random access memory (MRAM) cell includes a bottom electrode, a magnetic tunnel junction structure, a bipolar tunnel junction selector; and a top electrode. The tunnel junction selector includes a MgO tunnel barrier layer and provides a bipolar function for putting the MTJ structure in parallel or anti-parallel mode.

20 Claims, 35 Drawing Sheets

TUNNEL JUNCTION SELECTOR MRAM

BACKGROUND

In integrated circuit (IC) devices, magnetoresistive random access memory (MRAM) is an emerging technology for next generation non-volatile memory devices. MRAM is a memory structure including an array of MRAM cells. Each MRAM cell includes a magnetic tunnel junction (MTJ) element, and a resistance of the MTJ element is adjustable to represent logic "0" or logic "1". The MTJ element includes one reference layer and one ferromagnetic free layer separated by a tunneling insulating layer. The resistance of the MTJ element is adjusted by changing a direction of the magnetic moment of the ferromagnetic free layer with respect to that of the reference layer. The low and high resistances are utilized to indicate a digital signal "1" or "0", thereby allowing for data storage.

From an application point of view, MRAM has many advantages. MRAM has a simple cell structure and CMOS logic comparable processes which result in a reduction of the manufacturing complexity and cost in comparison with other non-volatile memory structures. Despite the attractive properties noted above, a number of challenges exist in connection with developing MRAM. Various techniques directed at configurations and materials of these MRAMs have been implemented to try and further improve device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
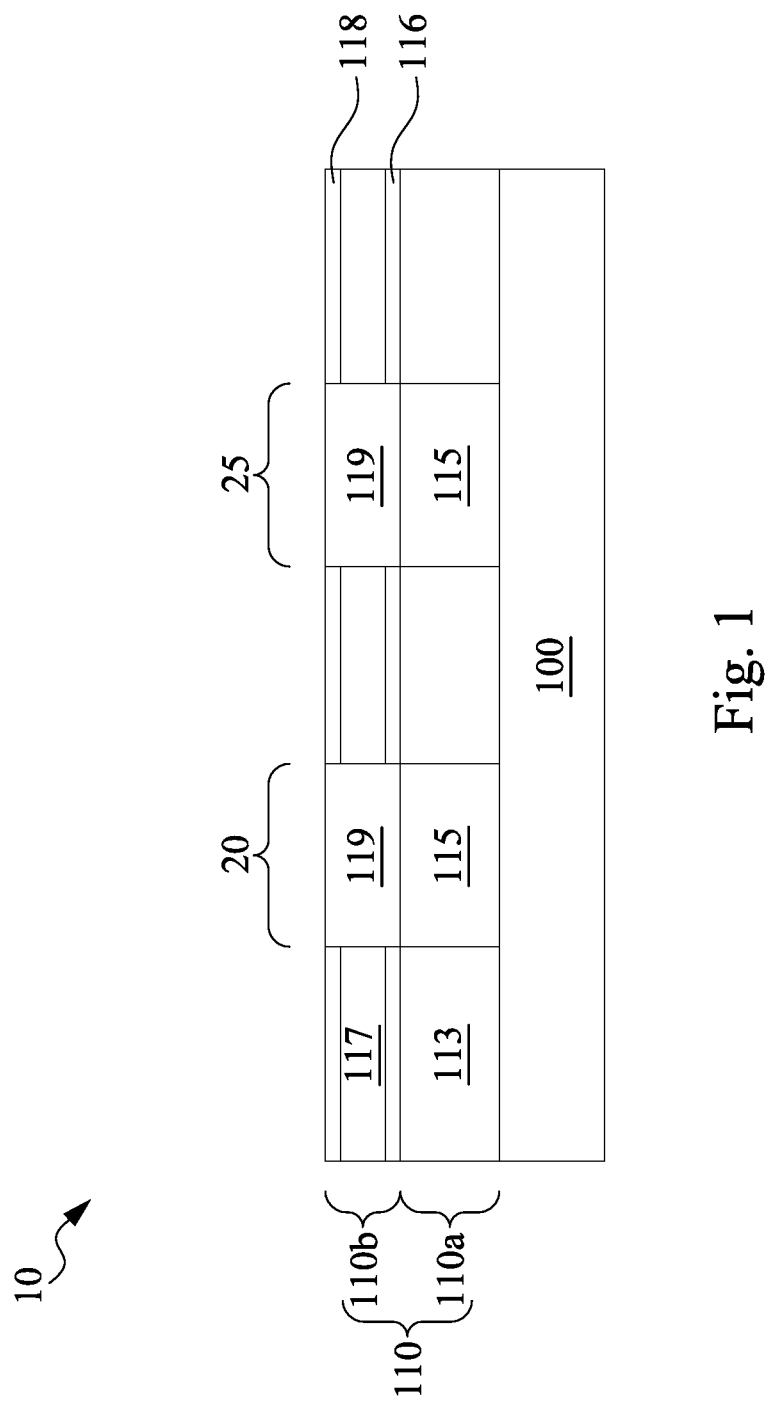
FIGS. 1 through 14 illustrate intermediate steps in the formation of an MRAM cell, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cell of an MRAM device requires current to be able to flow in both directions. Read operations require passing a small current in a forward direction to measure resistance across the MRAM cell, while write operations require passing a larger current in both forward and reverse directions to control the spin direction of electrons in a free layer in a magnetic tunnel junction (MTJ) of the MRAM cell. For example, a MRAM based memory device may use an access transistor to control the reverse current flow and ultimately the spin direction of the free layer of the MTJ of the MRAM cell. The access transistor can be switched using a write word line. One end of the MRAM cell is connected to a bit line and the other end of the MRAM cell is connected to a select line or read word line. This arrangement is known as a one transistor selector one magnetic tunnel junction (1T-1MTJ) MRAM cell. Although, this arrangement provides the ability to control the free layer spin, as cell sizes decrease with improved fabrication technologies, the access transistor would take a greater percentage of the foot print requirements for the MRAM cell.

Embodiments described herein eliminate the need for an access transistor. Instead a bipolar selector using a tunnel junction is used. Bipolar selectors generally, however, utilize unconventional materials or noble metal contacts. Bipolar selectors also generally suffer from limited endurance (less than about $10^6$ cycles). Embodiment processes, however, utilize a tunnel junction using MgO in the bipolar selector. This advantageously results in a robust and economical bipolar selector. The resulting tunnel junction selector can endure a high number of read/write accesses (greater than about $10^{16}$ cycles) and can sustain high current densities (greater than about 10 MA/cm$^2$). Embodiments describe an MRAM cell and device utilizing a one tunnel junction one magnetic tunnel junction (1TJ-1MTJ) configuration, thereby eliminating the need for an access transistor. Embodiments use a bipolar selector made from materials compatible with an MRAM cell and processes compatible with creating an MRAM devices and complementary metal oxide semiconductor (CMOS) devices.

Figure 15:
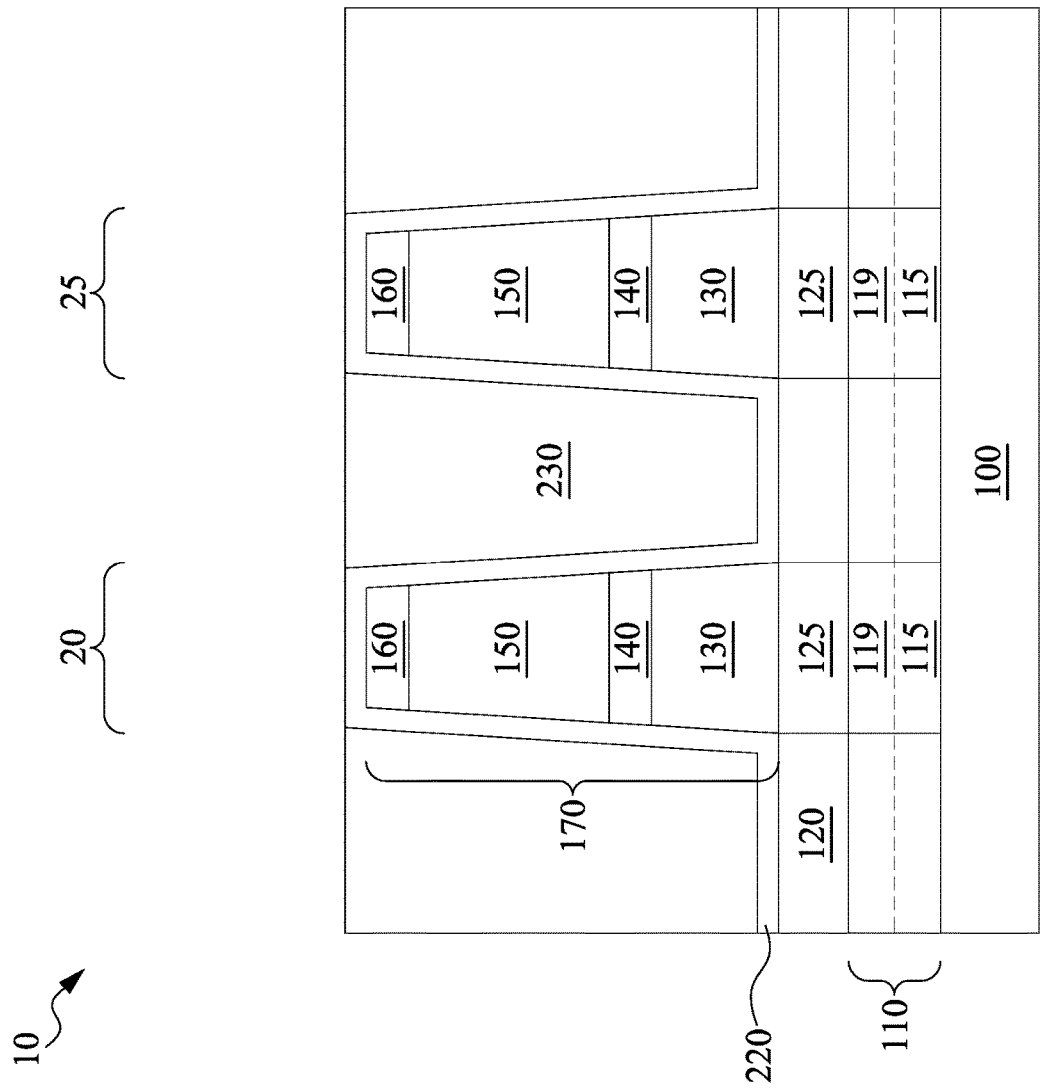
FIGS. 15 through 17 illustrate intermediate steps in the formation of an MRAM cell, in accordance with other embodiments.
Figure 16:
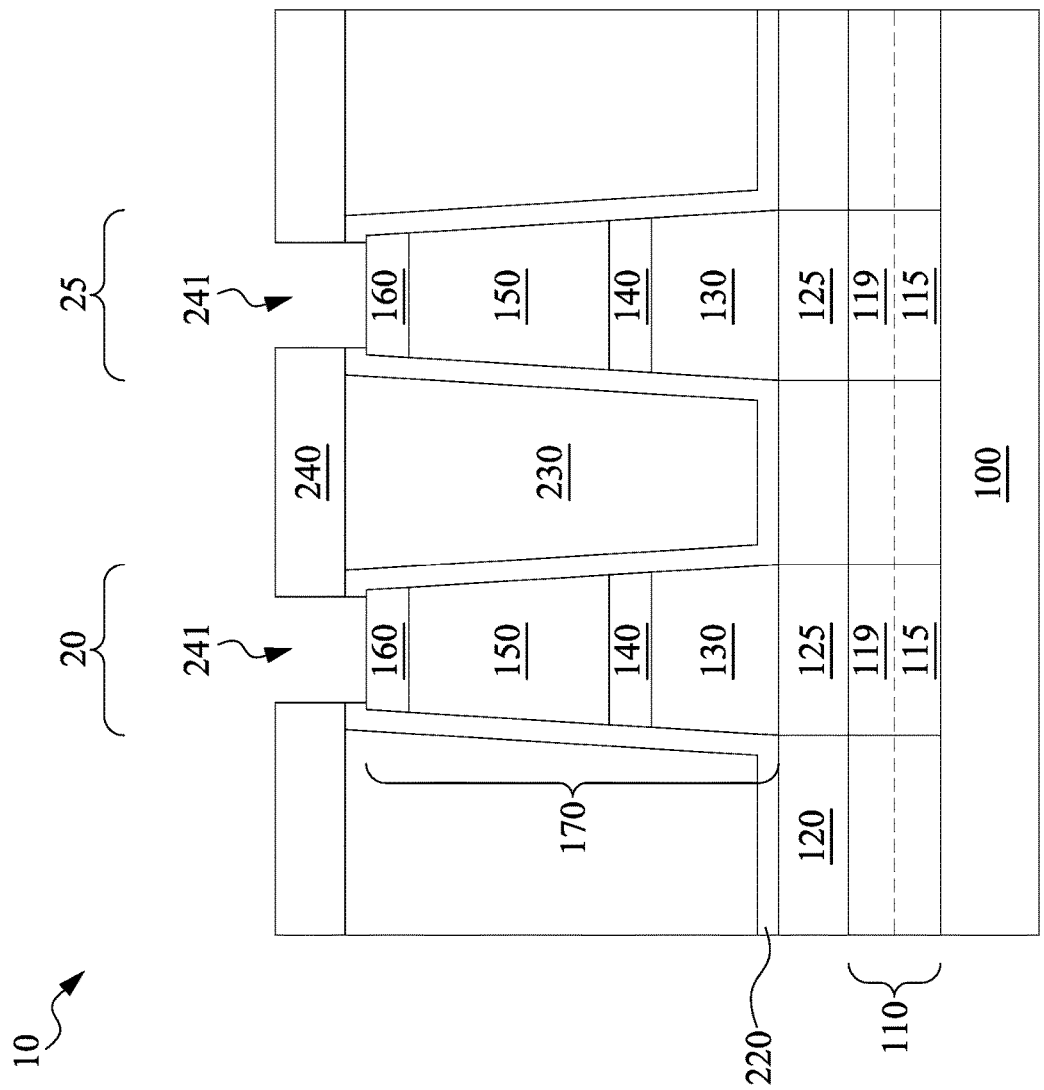
Figure 17:
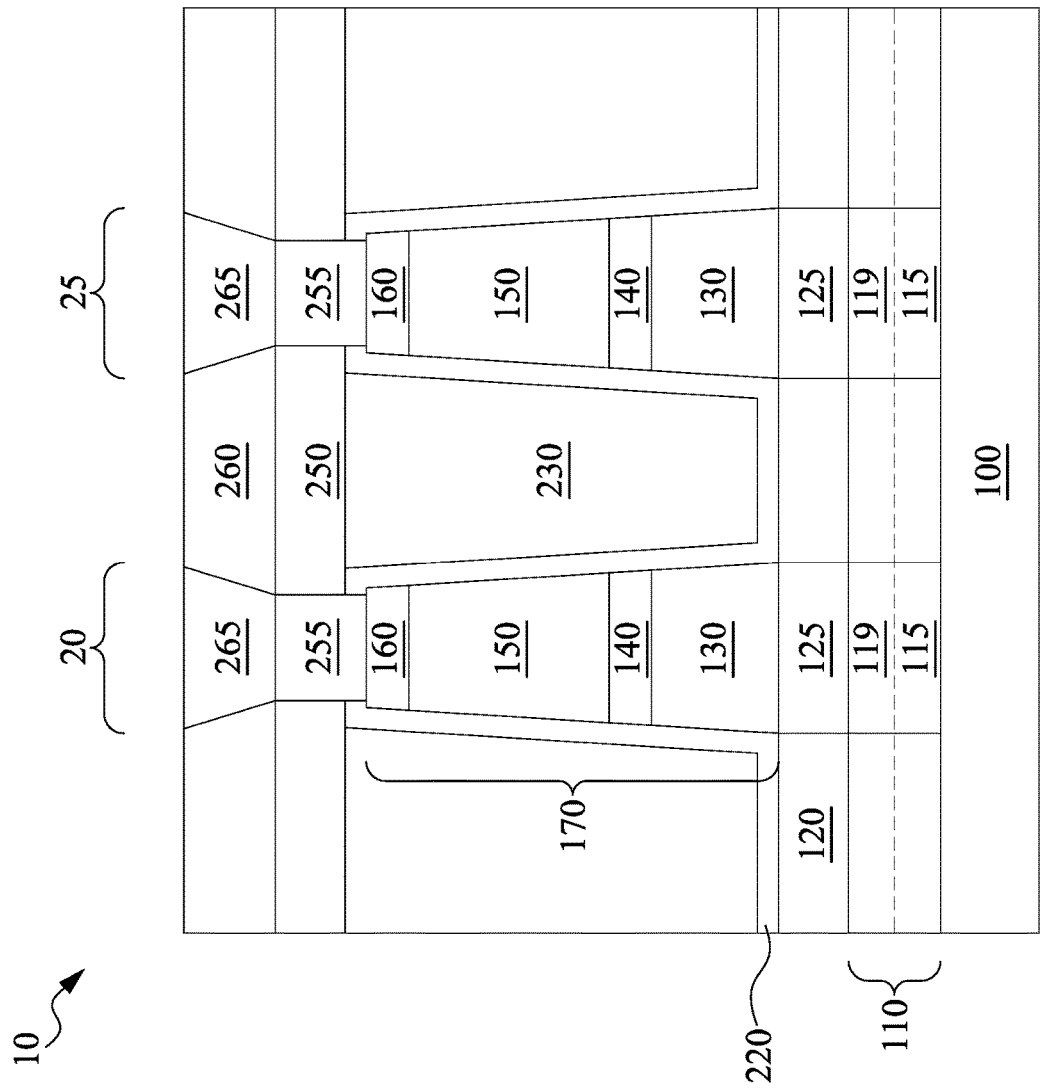
Figure 34:
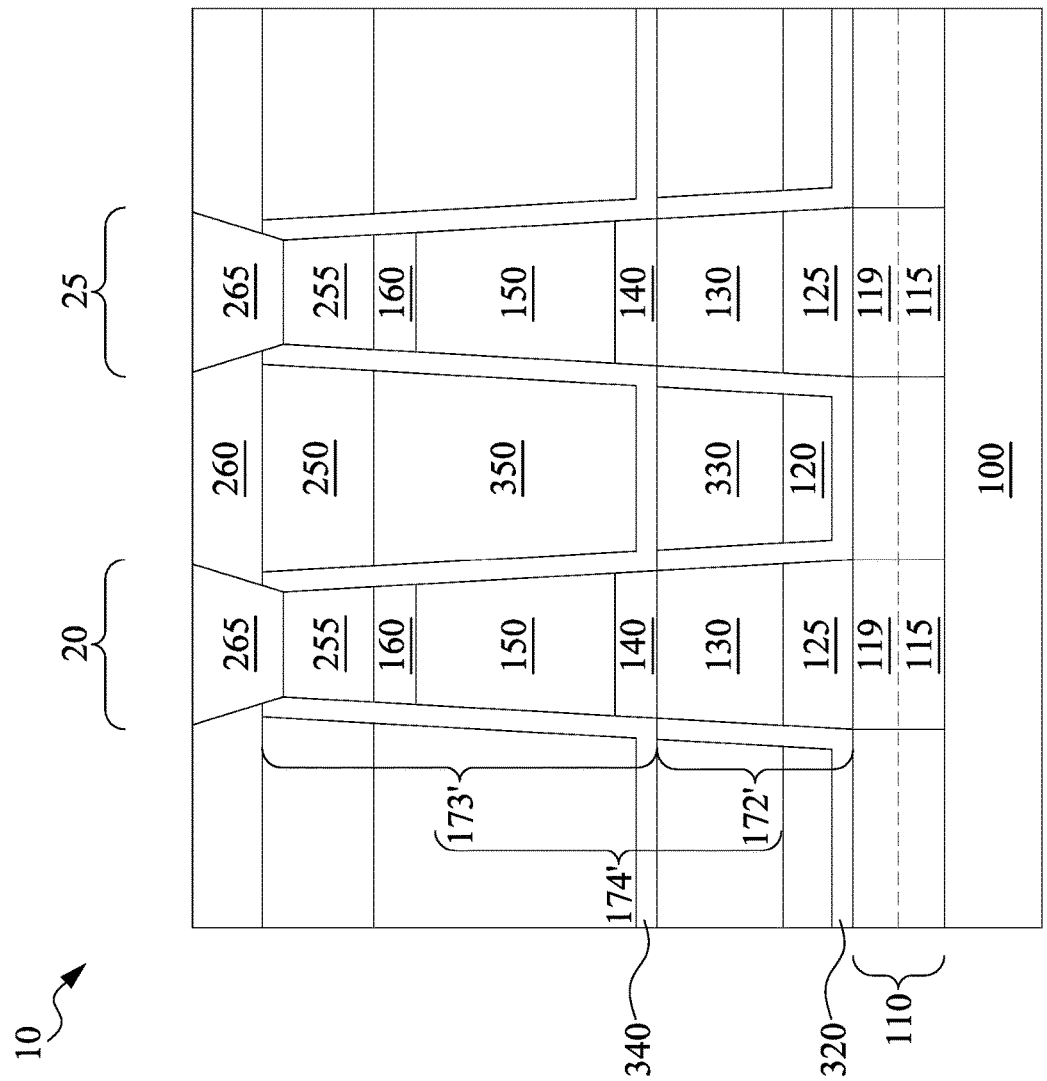
Figure 35:
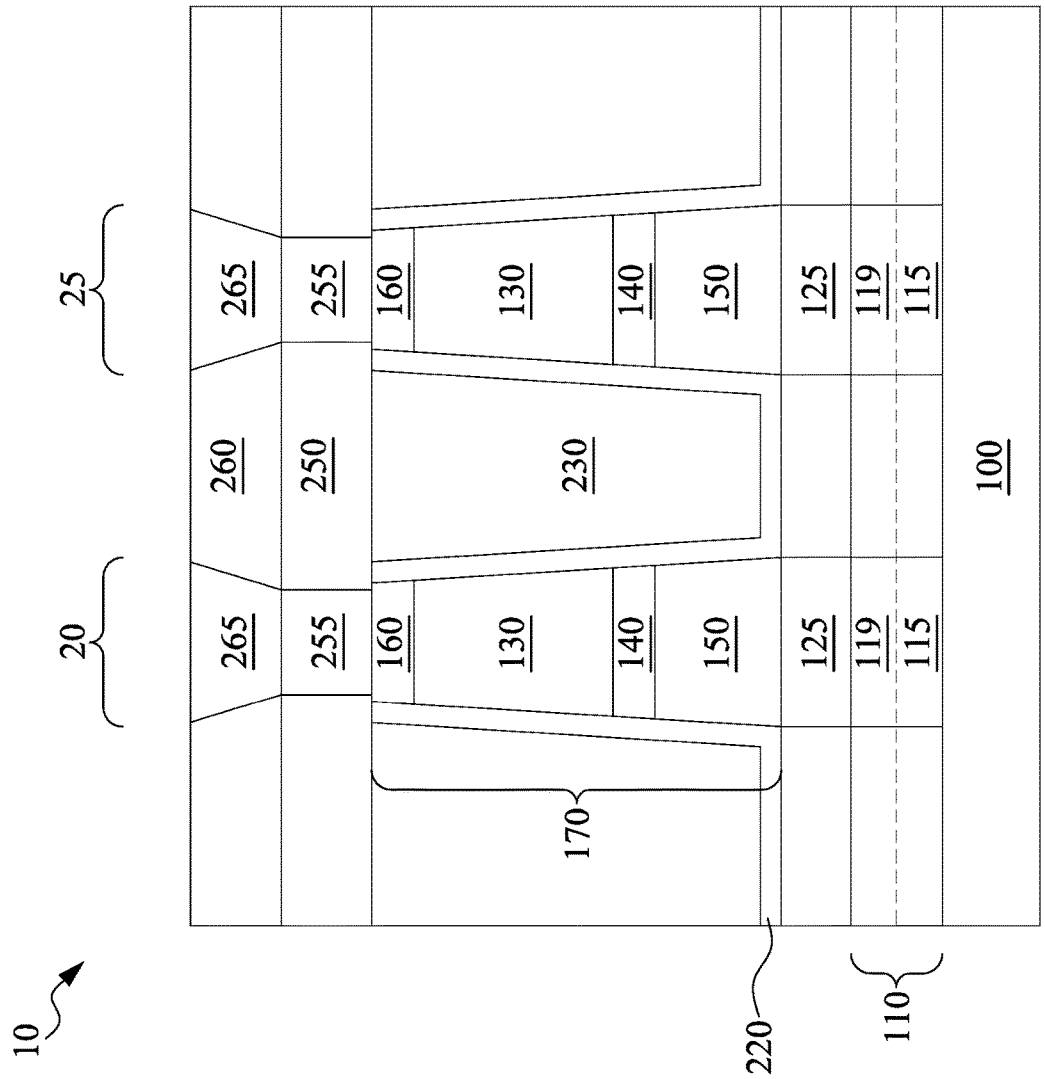
FIG. 35 illustrates an MRAM cell where the position of the tunnel junction selector and MTJ structure is changed, in accordance with some embodiments.

FIGS. 1 through 14 illustrate intermediate stages of the creation of an MRAM device 10 in accordance with some embodiments. FIGS. 15 through 17 illustrate intermediate stages of the creation of an MRAM device 10 in accordance with other embodiments. FIGS. 18 through 23 illustrate intermediate stages of the creation of an MRAM device 10 in accordance with yet other embodiments. FIGS. 24 through 33 illustrate intermediate stages of the creation of an MRAM device 10 in accordance with still other embodiments. FIG. 34 illustrates an MRAM device 10 following formation processes in accordance with another embodiment. FIG. 35 illustrates an MRAM device 10 where the formation order of features is changed, in accordance with some embodiments.

In FIG. 1, in some embodiments, the substrate 100 may be a substrate and the MRAM device 10 is formed on the substrate. MRAM device 10 may include several MRAM cell areas, including MRAM cell 20 and MRAM cell 25. After the layers of the MRAM cells of the MRAM device 10 are made, the cells are patterned into individual MRAM cells.

In some embodiments, the substrate 100 may be formed of a semiconductor material such as silicon, silicon germanium, or the like. In some embodiments, the substrate 100 is a crystalline semiconductor substrate such as a crystalline silicon substrate, a crystalline silicon carbon substrate, a crystalline silicon germanium substrate, a III-V compound semiconductor substrate, or the like. In an embodiment the substrate 100 may comprise bulk silicon, doped or undoped, or an active layer of a silicon-on-insulator (SOI) substrate. Generally, an SOI substrate comprises a layer of a semiconductor material such as silicon, germanium, silicon germanium, or combinations thereof, such as silicon germanium on insulator (SGOI). Other substrates that may be used include multi-layered substrates, gradient substrates, or hybrid orientation substrates.

In some embodiments, the substrate 100 may be a carrier substrate without any active devices formed therein, such as a glass carrier substrate, a ceramic carrier substrate, or the like.

Redistribution structure 110 is formed over the substrate 100. In some embodiments, the redistribution structure 110 may be formed of an insulating material 113, such as a dielectric material. In some embodiments, the redistribution structure 110 may include an Inter-Metal Dielectric (IMD) layer or an Inter-Layer Dielectric (ILD) layer, which may include a dielectric material having a low dielectric constant (k value) lower than 3.8, lower than about 3.0, or lower than about 2.5, for example. The redistribution structure 110 may also include conductive features, such as the conductive features 115. The insulating material 113 of the redistribution structure 110 may be formed of PSG, BSG, BPSG, FSG, TEOS, Black Diamond (a registered trademark of Applied Materials Inc.), a carbon-containing low-k dielectric material, HSQ, MSQ, or the like.

The conductive features 115 may be coupled to an active or passive device (e.g., a transistor or other electrical component) which may be embedded in the substrate 100 or the redistribution structure 110 or formed in another substrate. The conductive features 115 may include, for example, a source/drain region of a transistor, a gate electrode, a contact pad, a portion of a via, a portion of a metal line, and so forth. Active devices may comprise a wide variety of active devices such as transistors and the like and passive devices may comprise devices such as capacitors, resistors, inductors and the like that together may be used to generate the desired structural and functional parts of the design. The active devices and passive devices may be formed using any suitable methods either within or else on the substrate 100 or the redistribution structure 110.

The conductive features 115 formed in the redistribution structure 110 may include, for example, contacts or metal lines, which may be formed of copper or a copper alloy. In some embodiments the conductive features 115 may be a part of an interconnect to provide addressing to the MRAM cells which will be formed in the MRAM device 10. In such embodiments, the conductive features 115 may be a control line, such as a bit line or word line. In some embodiments, conductive features 115 may include other conductive materials such as tungsten, aluminum, or the like. Furthermore, conductive features 115 may be surrounded by a conductive diffusion barrier layer (not shown) formed underlying and encircling the conductive features 115. The conductive diffusion barrier layer may be formed of titanium, titanium nitride, tantalum, tantalum nitride, or the like.

The conductive features 115 may be formed by any suitable process. For example, by a patterning and plating process where openings corresponding to the conductive features 115 are made, the conductive diffusion barrier layer deposited in the openings (if used), followed by a seed layer. Next, the conductive features 115 are formed by any suitable process, such as a plating process including electro-plating or electroless-plating. Following the formation of the conductive features 115, any excess material along with the excess seed layer and conductive diffusion barrier layer may be removed by suitable etching and/or polishing process, such as by a chemical mechanical polishing (CMP) process. Other suitable processes may be used to form the conductive features 115.

Redistribution structure 110 may include multiple layers of insulating material 113 and conductive features 115.

Also illustrated in FIG. 1, detail of a bottom via layer 110b of the redistribution structure 110 is illustrated, in accordance with some embodiments. Bottom via layer 110b may include an optional etch stop layer 116, insulating layer 117, bottom electrode vias 119, and optional nitrogen free anti reflective coating (NFARC) layer 118. Etch stop layer 116 may be deposited over the redistribution structure 110, and may be made of one or more layers. In some embodiments, etch stop layer 116 may comprise a nitride, oxide, carbide, carbon-doped oxide, and/or combinations thereof. In some embodiments, etch stop layer 116 may also include metal or semiconductor material, such as an oxide, nitride, or carbide of a metal or semiconductor material. Such materials may include, for example, aluminum nitride, aluminum oxide, silicon carbide, silicon nitride, and the like. The etch stop layer 116 may include multiple layers of the same or different material. Etch stop layer 116 may be formed by any suitable method, such as by Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. In accordance with some embodiments, the etch stop layer 116 may also be utilized as a diffusion barrier layer for preventing undesirable elements, such as copper, from diffusing into a subsequently formed layer. The etch stop layer 116 may be deposited to a total thickness of between about 30 Å and about 100 Å, such as about 50 Å, though other values may be used and are contemplated.

Following depositing the etch stop layer 116, insulating layer 117 may be formed using any suitable material by any suitable formation process. In one embodiment, the insulating layer 117 may include an insulating material, such as a silicon oxide network formed using tetraethylorthosilicate (TEOS), tetramethylorthosilicate (TMOS), or the like. The insulating layer 117 may be formed by any suitable process, such as by Plasma Enhance Chemical Vapor Deposition (PECVD), High-Density Plasma (HDP) deposition, or the like. In some embodiments, the insulating layer 117 may include silicon carbide, silicon oxynitride, or the like.

In some embodiments, the bottom via layer 110b may include a NFARC layer 118 which may be formed to aid in a subsequent photo patterning process. The NFARC 118 may be formed using any acceptable process and may include any suitable material. In some embodiments, a separate NFARC 118 is not used and the insulating layer 117 may be used as a NFARC.

Next, the insulating layer 117 is patterned and openings are formed in the insulating layer 117 and etch stop layer 116 to expose corresponding conductive features 115. The openings may be formed by any suitable method. For example, openings may be made in the NFARC layer, insulating layer 117, and the etch stop layer 116, and may be formed by a photo-patterning process, using a patterned photo resist (not shown). The pattern of the patterned photo resist may be transferred to each of the layers by appropriate etching process using etchants selective to the material of each layer. In some embodiments, the NFARC layer 118 (if used) may act as a hard mask. In other embodiments, a separate hard mask (not shown) may be deposited over the NFARC layer 118 prior to etching the openings for the bottom electrode vias 119. After the conductive features 115 are exposed by these openings, openings are then filled with a conductive material to form bottom electrode vias 119.

In some embodiments, a conductive barrier layer (not shown) may be formed in the openings prior to filling the openings with the conductive material. The conductive barrier layer may be similar to that described above with respect to conductive features 115. In some embodiments, the conductive material of the bottom electrode vias 119 may overfill the via openings and a subsequent planarization process, such as a chemical mechanical polishing (CMP) process may be used to remove excess conductive material of the bottom electrode vias 119 and planarize the top of the bottom electrodes vias 119 to the top of the NFARC layer 118. In embodiments which also use a conductive barrier layer to line the via openings, excess portions thereof which may be formed on the NFARC layer 118 may also be removed by the planarization process. The bottom electrode vias 119 may be deposited and planarized to a thickness of about 50 Å to about 500 Å, though other thicknesses are contemplated and may be used.

The conductive material of the bottom electrode vias 119 may be formed by any suitable deposition process, such as by electro-plating, electroless plating, DC PVD, RFDC PVD, CVD, ALD, pulse DC, PVD, and the like. Please note that the detail of the redistribution structure 110 in layer 110*a* and bottom electrode via layer 110*b* are omitted in further drawings.

Figure 2:
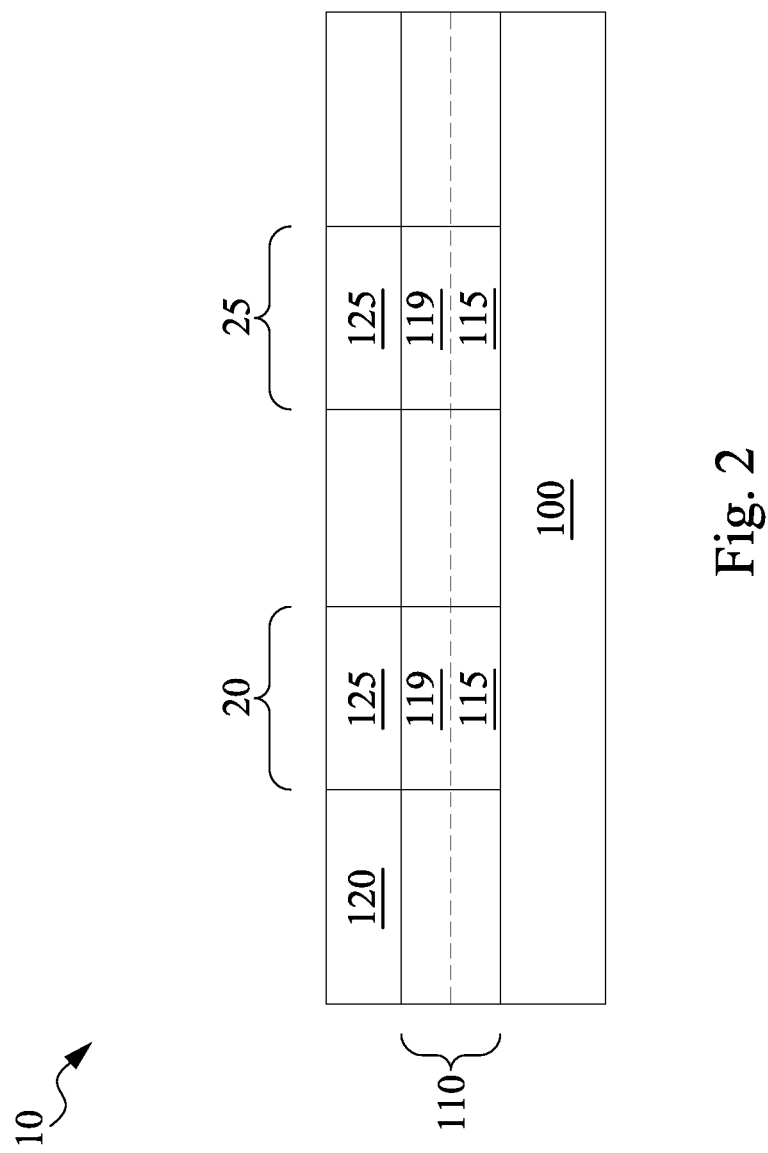

In FIG. 2 a bottom electrode 125 of the MRAM device 10 is formed. A different process for forming the bottom electrode 125 will be described with respect to FIG. 18, below. In some embodiments, the bottom electrode 125 may be formed by first depositing an insulating layer 120, patterning the insulating layer 120 to form openings therein which expose the bottom electrode via 119, and then depositing the materials of the bottom electrode 125 in the openings. The insulating layer 120 may be made and patterned using materials and processes similar to those discussed above with respect to insulating material 113 which are not repeated. In some embodiments, the bottom electrodes 125 may include a single layer, while in other embodiments, the bottom electrodes 125 may include multiple distinct layers of either the same material or of distinctive materials. In some embodiments, the bottom electrodes 125 may include a single layer of titanium nitride, tantalum nitride, nitrogen, titanium, tantalum, tungsten, cobalt, copper, or the like. In some embodiments, the bottom electrodes 125 may include a multi-layer structure of titanium nitride, titanium, and titanium nitride; tantalum nitride, tantalum, and tantalum nitride; tantalum, tantalum nitride, and tantalum; titanium, titanium nitride, and titanium; tantalum and titanium nitride; titanium and tantalum nitride; titanium nitride and tantalum nitride; titanium nitride and tungsten; tantalum nitride and tungsten; and so forth.

Figure 3:
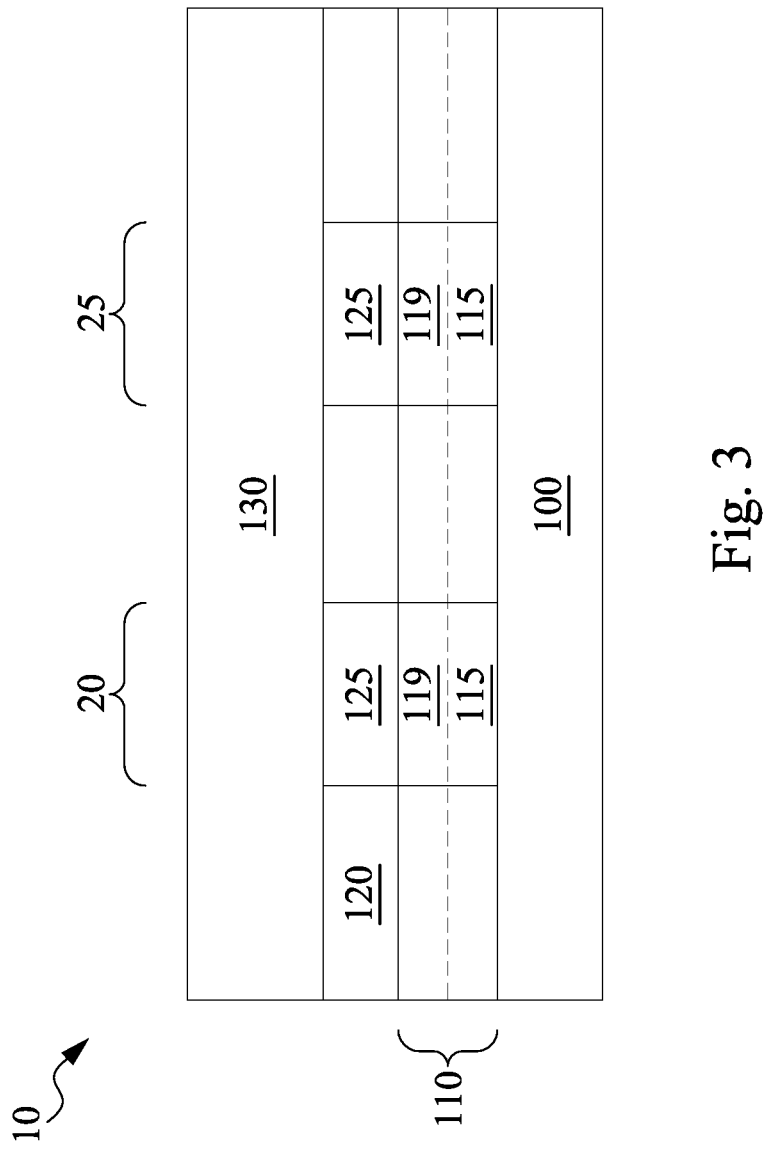

In FIG. 3, following the formation of the bottom electrodes 125 of the MRAM device 10, the magnetic tunnel junction (MTJ) structure 130 may be formed. The MTJ structure 130 may include any suitable configuration for a MTJ of an MRAM device, such as MRAM device 10. Various configurations for MTJ structure 130 are discussed with respect to FIGS. 4A and 4B.

Figure 4A:
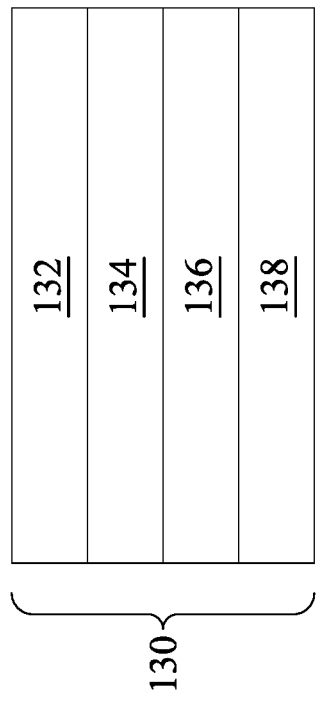
Figure 4B:
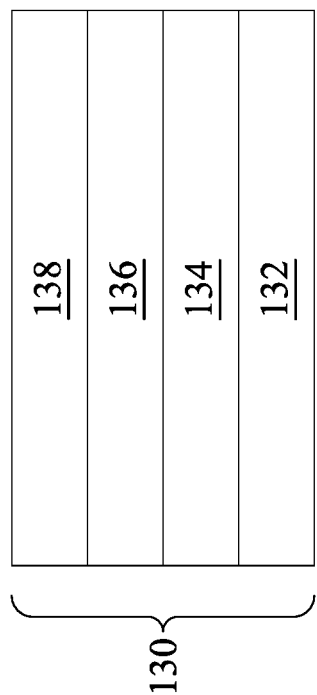

Referring to FIGS. 4A and 4B, various example configurations of MTJ structure 130 are illustrated, in accordance with some embodiments. It should be understood that any suitable structure may be used for the MTJ structure 130.

In FIGS. 4A and 4B, the layers of the MTJ structure 130 may include an antiferromagnetic layer 132, a reference layer 134, and a free layer 138. The antiferromagnetic layer 132 is sometimes referred to as a synthetic antiferromagnetic layer. The reference layer 134 is sometimes referred to as a fixed layer. In FIGS. 4A and 4B, the MTJ structure 130 also includes one or more tunnel barrier layers 136 disposed between the reference layer 134 and the free layer 138. In FIG. 4B, the MTJ structure 130 is inverted from that of FIG. 4A and is illustrated to include the tunnel barrier layer 136 interposed between the reference layer 134 and the free layer 138. In addition, more or fewer layers of the MTJ structure 130 may be incorporated into the MRAM device 10.

In FIG. 4A, the antiferromagnetic layer 132 is formed on the bottom electrode 125, the reference layer 134 is formed over the antiferromagnetic layer 132, and the free layer 138 is formed over the reference layer 134. However, other arrangements of the MTJ structure 130 are contemplated, such as illustrated in FIG. 4B, where the free layer 138 is formed on the bottom electrode 125, the reference layer 134 is formed over the free layer 138, and the antiferromagnetic layer 132 is formed over the reference layer 134. The antiferromagnetic layer 132, the reference layer 134, and the free layer 138 may be formed sequentially.

The antiferromagnetic layer 132 may be formed of a metal alloy including manganese (Mn) and another metal(s) such as platinum (Pt), iridium (Ir), ruthenium (Ru), rhodium (Rh), nickel (Ni), palladium (Pd), iron (Fe), osmium (Os), or the like. Accordingly, the antiferromagnetic layer 132 may be formed of platinum manganese (PtMn), iridium manganese (IrMn), ruthenium manganese (RuMn), rhodium manganese (RhMn), nickel manganese (NiMn), palladium manganese (PdPtMn), iron manganese (FeMn), osmium manganese (OsMn), alloys thereof, or the like. The reference layer 134 and antiferromagnetic layer 132 may be formed of different materials or the same materials. The reference layer 134 and free layer 138 may be formed of a ferromagnetic material alloy such as cobalt iron (CoFe), nickel iron (NiFe), cobalt iron boron (CoFeB), cobalt iron boron tungsten (CoFeBW), or the like. The tunnel barrier layer 136 may be formed from magnesium oxide (MgO), aluminum oxide ($Al_2O_3$), aluminum nitride (AlN), aluminum oxynitride (AlON), hafnium oxide ($HfO_2$), zirconium oxide ($ZrO_2$), spinel alloys, such as spinel ($MgAl_2O_4$), chrysoberyl ($BeAl_2O_4$), gahnite ($ZnAl_2O_4$), galaxite ($MnAl_2O_4$), magnesiochromite ($MgCr_2O_4$), zincochromite ($ZnCr_2O_4$), combinations thereof, or the like. It should be recognized that the various layers of the MTJ structure 130 may be formed of other materials. The antiferromagnetic layer 132, reference layer 134, free layer 138, and tunnel barrier layer 136 may respectively be formed using any suitable process, for example, by PVD, DC PVD, RFDC PVD, CVD, ALD, pulse DC, and so forth and may be formed in single or multiple layers.

Figure 5:
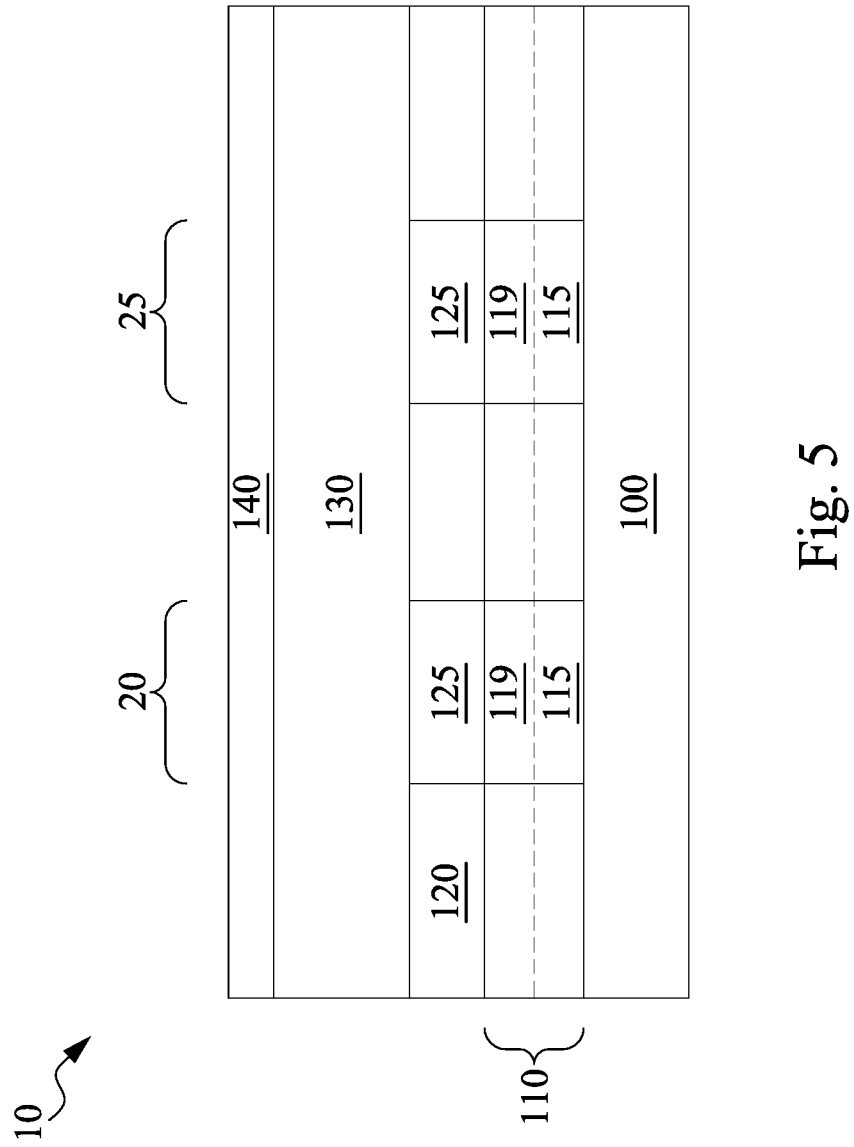

In FIG. 5 a hard mask 140 is formed over the MTJ structure 130. In a subsequent process, the hard mask 140 will be patterned and used as an etch mask in forming the pillars of the MRAM cells. The hard mask 140 may be made of any suitable back-end-of-line material for metal hard masks such as titanium nitride, tantalum nitride, or the like. In some embodiments, the hard masks 140 may be made of a composition which includes tantalum, tungsten, chromium, ruthenium, molybdenum, silicon, germanium, other MRAM compatible metals, or combinations thereof, such as nitrides and/or oxides of these materials. The hard mask 140 may be formed using any suitable process, for example, by PVD, DC PVD, RFDC PVD, CVD, ALD, pulse DC, and so forth, to a thickness between about 10 nm and 30 nm, though other thicknesses may be used.

Figure 6:
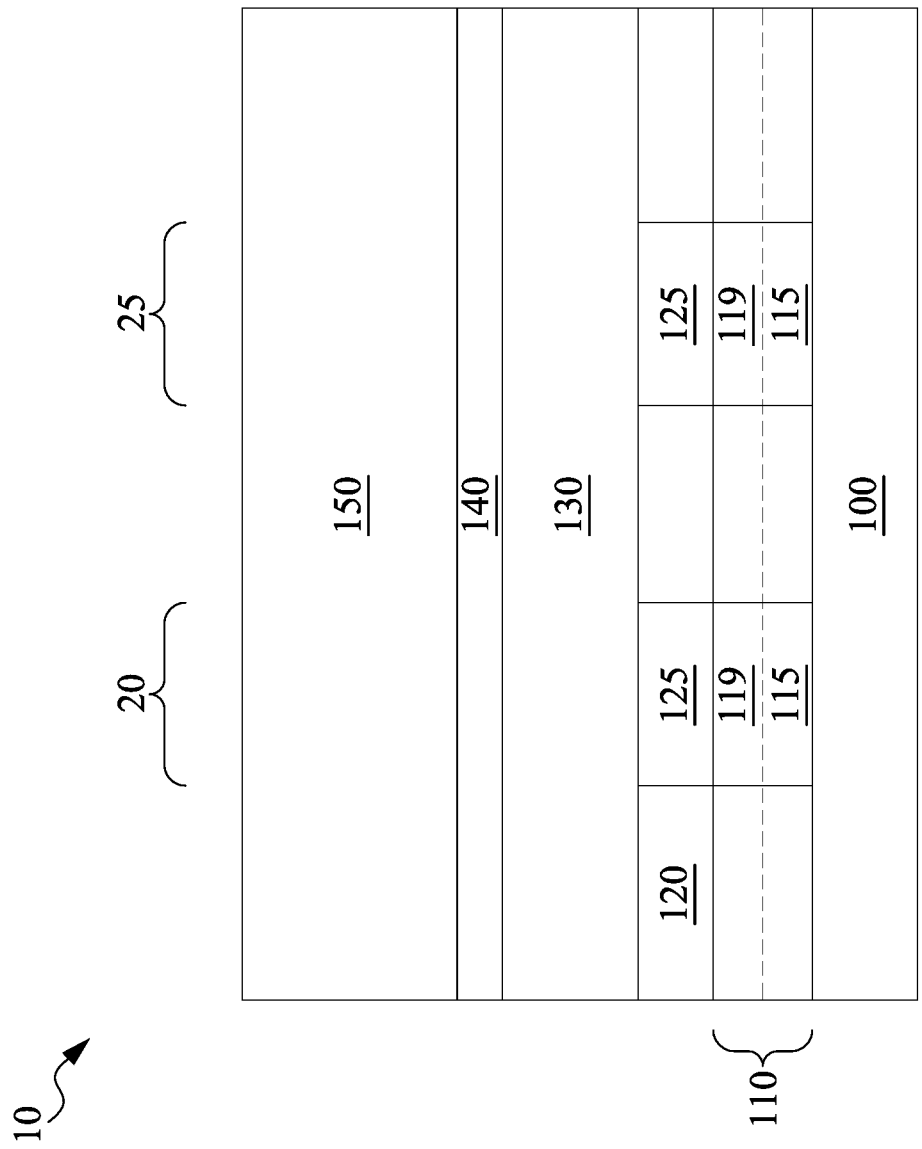

In FIG. 6, a tunnel junction selector 150 is formed over the hard mask 140. The tunnel junction selector 150 may serve as a bipolar selector to set electron spin of the free layer of the MRAM cell. The tunnel junction selector 150 may include multiple layers and have an overall thickness between about 10 nm to about 115 nm, depending on the tunnel junction selector 150, though other thicknesses may be used. The details for the formation of the tunnel junction selector are described with respect to FIGS. 7A and 7B.

The tunnel junction selector 150 acts as a bipolar selector by mimicking the behavior of a Schottky diode. In other words, the tunnel junction selector acts as a Schottky barrier. As such, forward bias voltage allows current to freely flow in the forward direction, while a reverse bias voltage can temporarily overcome the barrier properties and allow current to flow in the reverse direction. This property allows the magnetic spin of the free layer 138 of the MTJ structure 130 to be put into parallel or anti-parallel mode with the reference layer 134, and thereby control the resistance associated with the MRAM cell.

Figure 7B:
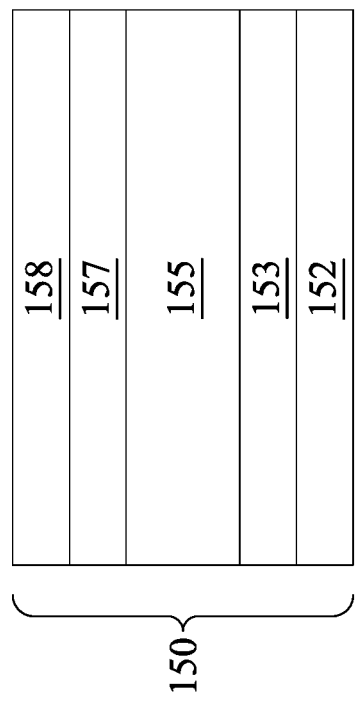
Figure 7A:
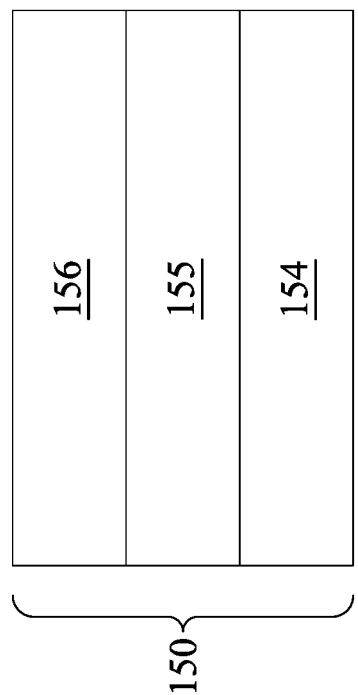

In FIG. 7A, a tunnel junction selector 150 including three layers is illustrated. Bottom contact layer 154 of the tunnel junction selector 150 may be made of any contact material which is suitable for use in an MRAM cell, including metals or semiconductors. For example, bottom contact layer 154 may include tantalum, tungsten, chromium, ruthenium, molybdenum, silicon, germanium, other MRAM compatible metals, or combinations thereof, such as nitrides and/or oxides of these materials. An MRAM compatible metal indicates a metal which is non-magnetic. Some magnetic metals can be used as well, for example, an MRAM compatible metal may include, a cobalt iron boron alloy (CoFeB), where a large boron content (greater than about 50% by weight) would render the alloy non-magnetic.

Bottom contact layer 154 may be deposited using any suitable method, for example, by PVD. DC PVD, RFDC PVD, CVD, ALD, pulse DC, and so forth, to a thickness between about 5 nm and 20 nm, though other thicknesses may be used.

Following the deposition of the bottom contact layer 154, the tunnel layer 155 may be formed over the bottom contact layer 154. The tunnel layer 155 may comprise magnesium oxide (MgO) and may be between about 0.5 nm and about 5 nm thick or between about 0.5 nm and about 3.5 nm thick, such as about 1.5 nm thick. With thicker MgO (greater than about 2.5 nm) and bias, partly due to the inclusion of a greater series with the MTJ structure, the transport through direct tunneling through MgO and through interface state tunneling becomes more significant, indicating a greater contribution of tunneling current. The tunnel layer 155 is thin enough that electrons are able to tunnel through the tunnel layer 155 when a biasing voltage is applied on the MRAM cell, such as MRAM cell 25. Thicknesses beyond 5 nm are impractical due to a greater contribution of current needed to achieve tunneling as the tunnel layer 155 thickness increases. Thicknesses less than 0.5 nm may be ineffective to achieve the Schottky barrier properties needed in a bipolar selector. The tunnel layer 155 may be formed using any suitable method, for example, by PVD, DC PVD, RFDC PVD, CVD, ALD, pulse DC, and so forth.

As noted above, using MgO as the material of the tunnel layer 155 has the advantage of providing a robust material which can endure a high number of read/write cycles (e.g., forward bias and reverse bias alternating states). Moreover, the MgO material can sustain higher current densities than other materials so that a thicker MgO material layer may be used as necessary to achieve suitable Schottky behavior.

In one embodiment, a PVD process is used to deposit the tunnel layer 155 on the bottom contact layer 154. The tunnel layer 155 may be grown at or near room temperature, for example, between about 15° C. to about 40° C., though other temperatures may be used and are contemplated. The resulting tunnel layer 155 includes an MgO layer exhibiting strong crystallinity, i.e. having a dominant crystalline orientation and structure.

Following the deposition of the tunnel layer 155, a top contact layer 156 is formed. The top contact layer 156 may be formed using processes and materials similar to those discussed above with respect to the bottom contact layer 154.

Following the deposition of the top contact layer 156 the tunnel junction selector 150 may be annealed by a low temperature anneal, for example, between about 200° C. to about 400° C., for about 1 second to about 180 minutes, though other temperatures and anneal times are contemplated. During this anneal, the crystallinity of the MgO of the tunnel layer 155 is transferred to the contacting metal or semiconductor material electrode layers—the bottom contact layer 154 and top contact layer 156.

In FIG. 7B, a tunnel junction selector 150 including five layers is illustrated, in accordance with some embodiments. In these embodiments, the contact layers (the top contact layer 156 and bottom contact layer 154 of FIG. 7A) are replaced with a two layer structure, including a contact layer and an interlayer between the contact layer and the tunnel layer 155. When an n-type or p-type semiconductor, such as silicon or germanium, respectively, is used as the top contact layer 156 or bottom contact layer 154, an implicit Schottky barrier is formed because there is a depletion region in the semiconductor material. Especially where certain metal materials are used in the top contact layer 156 or bottom contact layer 154, however, an interlayer between the contact layer and the tunnel layer 155 promotes non-linearity of the IV curve. Without such non-linearity, there is a risk that the tunnel junction selector 150 would simply add in series with the MTJ structure 130, and therefore degrade the magneto-resistive properties of the MRAM device 10.

Bottom contact layer 152 of FIG. 7B may be deposited using materials and processes similar to the bottom contact layer 154 of FIG. 7A. Bottom contact layer 152 may be deposited to a thickness between about 5 nm to about 50 nm, though other thicknesses are contemplated and may be used.

Interlayer 153 may be formed over the bottom contact layer 152. Interlayer 153 may be an ultrathin oxide or nitride layer, between about 1 nm and about 5 nm. In some embodiments, interlayer 153 may include titanium oxide (TiO$_2$), hafnium oxide (HfO$_2$), silicon oxide (SiO$_2$), and so forth. In some embodiments, interlayer 153 may include titanium nitride (TiN), hafnium nitride (HfN), silicon nitride (Si$_x$N$_y$), and so forth. Other suitable materials may be used. The interlayer 153 may be formed using any suitable techniques. In some embodiments, for example, the interlayer 153 may be formed in situ by deposition of a metal or semiconductor material with an oxygen treatment or a nitrogen treatment, such as deposition in an oxygen ambient environment, deposition in an oxygen enriched environment, deposition followed by an oxygen plasma treatment or exposure to natural oxygen for spontaneous oxidation, or deposition with a nitridization process. The interlayer 153 may be formed using any suitable method, for example, by PVD. DC PVD, RFDC PVD, CVD, ALD, pulse DC, and so forth.

In other embodiments, the interlayer 153 may be formed by scavenging oxygen atoms from a nearby source. For example, during or after formation of the tunnel layer 155 in FIG. 7b, discussed below, atoms from the MgO material may be incorporated into a bottom contact layer, such as bottom contact layer 152, to convert some of the bottom contact layer into the interlayer 153. In some embodiments, an interlayer metal or interlayer semiconductor material may be deposited separate from the bottom contact layer 152, which is then converted to an oxide by scavenging oxygen from the tunnel layer 155.

The tunnel layer 155 may be formed over the bottom contact layer 152 using materials and processes similar to those discussed above with respect to the tunnel layer 155 of FIG. 7A. As noted above, in some embodiments the tunnel layer 155 may be formed directly on the bottom contact layer 152 and the interlayer 153 subsequently formed from scavenged oxygen atoms from the MgO of the tunnel layer 155. In other embodiments, the tunnel layer 155 may be formed directly on the interlayer 153.

Interlayer 157 may be formed over the tunnel layer 155. Interlayer 157 may be formed using processes and materials similar to those discussed above with respect to interlayer 153. In particular, interlayer 157 may be a deposited metal or semiconductor material which is in situ oxidized through an oxygen treatment. Interlayer 157 may be a silicon oxide network formed using a suitable deposition technique for silicon oxide. Interlayer 157 may also be formed using scavenged oxygen atoms from the tunnel layer 155 to oxidize a metal or a semiconductor material, such as a portion of the top contact layer 158 after it is formed or an interlayer of a metal or semiconductor material. Interlayer 157 may also be a deposited metal or semiconductor material which is combined with nitrogen using a nitridization process.

In some embodiments, either one or both of interlayer 153 and interlayer 157 may be utilized. Where both interlayer 153 and interlayer 157 are utilized, they may be the same material or different materials. Also, where both interlayer 153 and interlayer 157 are utilized they may be formed by the same or different techniques.

The top contact layer 158 may be formed using processes and materials similar to those discussed above with respect to top contact layer 156 (or bottom contact layer 154) of FIG. 7A. The top contact layer 158 may be deposited to a thickness between about 5 nm to about 50 nm, though other thicknesses are contemplated and may be used.

Following formation of the top contact layer 158, the tunnel junction selector 150 may be annealed using processes and conditions similar to those discussed above with respect to FIG. 7A. During this anneal, the crystallinity of the MgO layer may be transferred to the interlayers, interlayer 153 and interlayer 157, and may be transferred to the top contact layer 158 and bottom contact layer 152. In the same anneal or in a separate anneal process, in some embodiments, oxygen from the tunnel layer 155 may diffuse into the interlayer 153 or bottom contact layer 152 to form an oxide of the interlayer 153 or of the bottom contact layer 152 (which then results in the interlayer 153). Similarly, oxygen from the tunnel layer 155 may diffuse into the interlayer 157 or top contact layer 158 to form an oxide of the interlayer 157 or of the top contact layer 158 (which then results in the interlayer 157).

Figure 8:
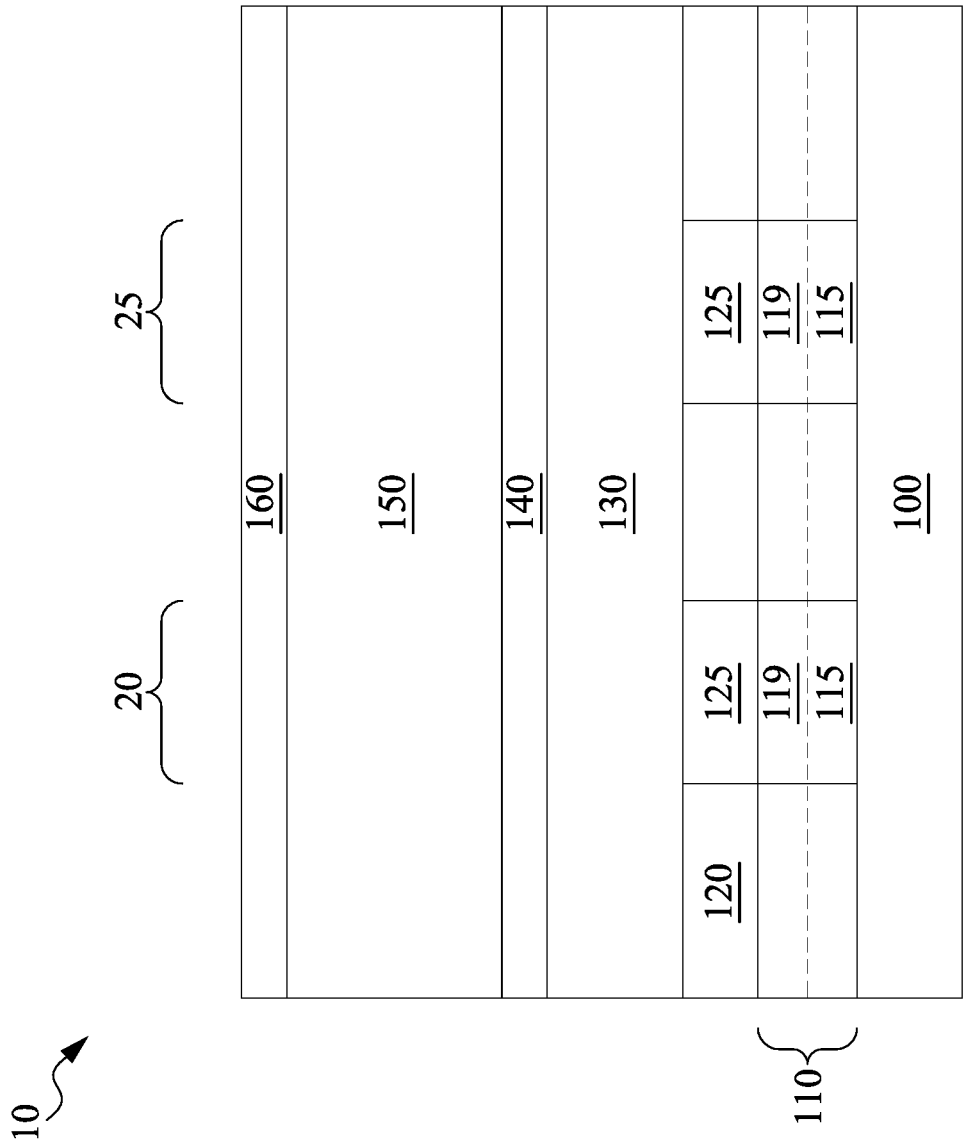

In FIG. 8, a hard mask 160 is formed over the tunnel junction selector 150. Hard mask 160 may be formed using materials and processes similar to those discussed above with respect to hard mask 140. In a subsequent process, the hard mask 160 will be patterned and used as an etch mask in forming the pillars of the MRAM cells. In some embodiments, the hard mask 160 is made of different materials than the hard mask 140. In other embodiments, such as discussed below with respect to FIGS. 25 through 34, the same material may be used, since the respective underlying layers are etched in different steps.

Figure 9:
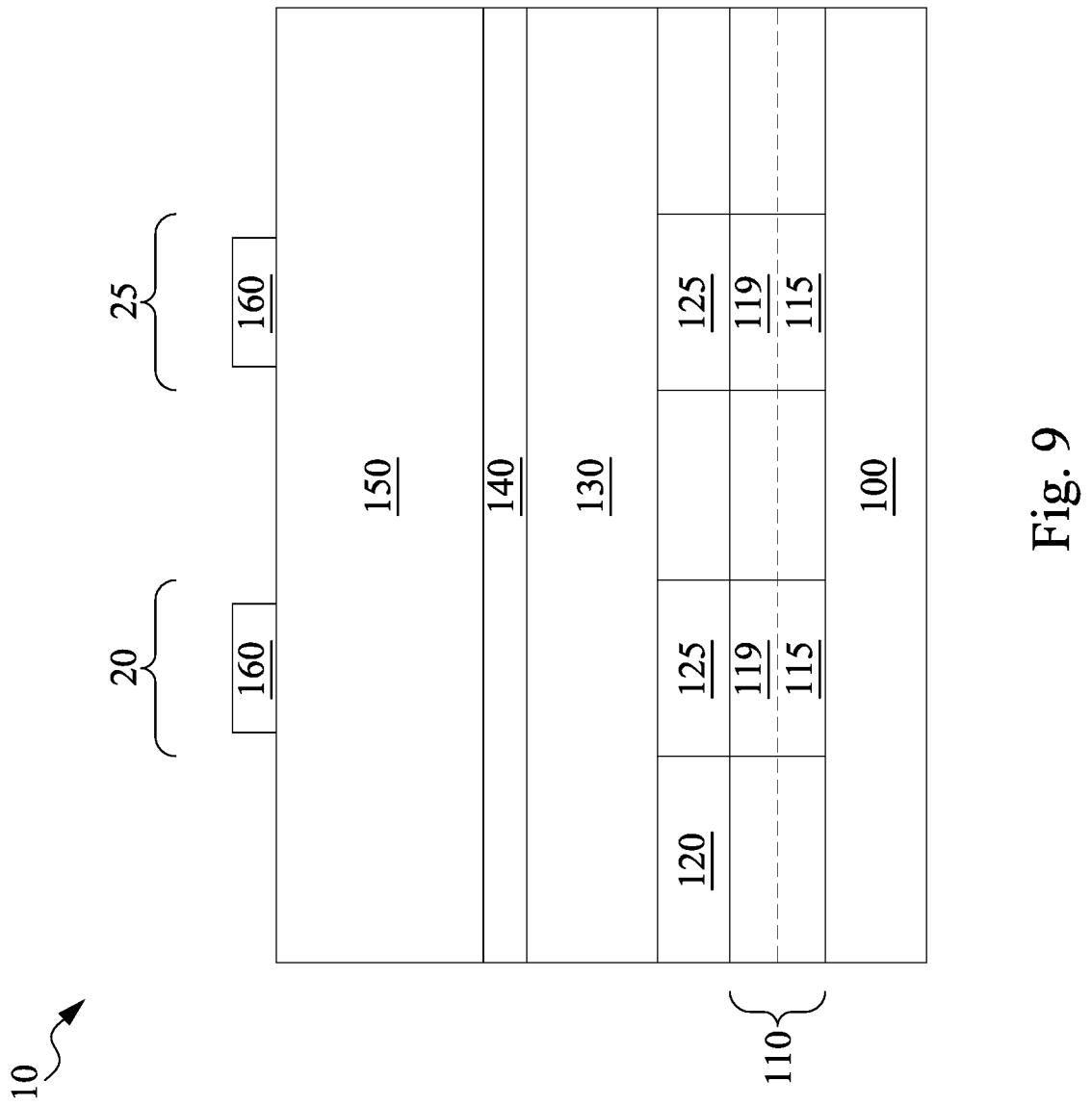

In FIG. 9, the hard mask 160 is patterned to protect the MRAM cells, such as MRAM cell 20 and MRAM cell 25 during patterning the tunnel junction selector 150 and hard mask 140. Following patterning the tunnel junction selector 150 and hard mask 140, the hard mask 140 is also used in patterning the MTJ structure 130. The patterning of the hard mask 160 may be done by any suitable photo patterning technique.

Figure 10:
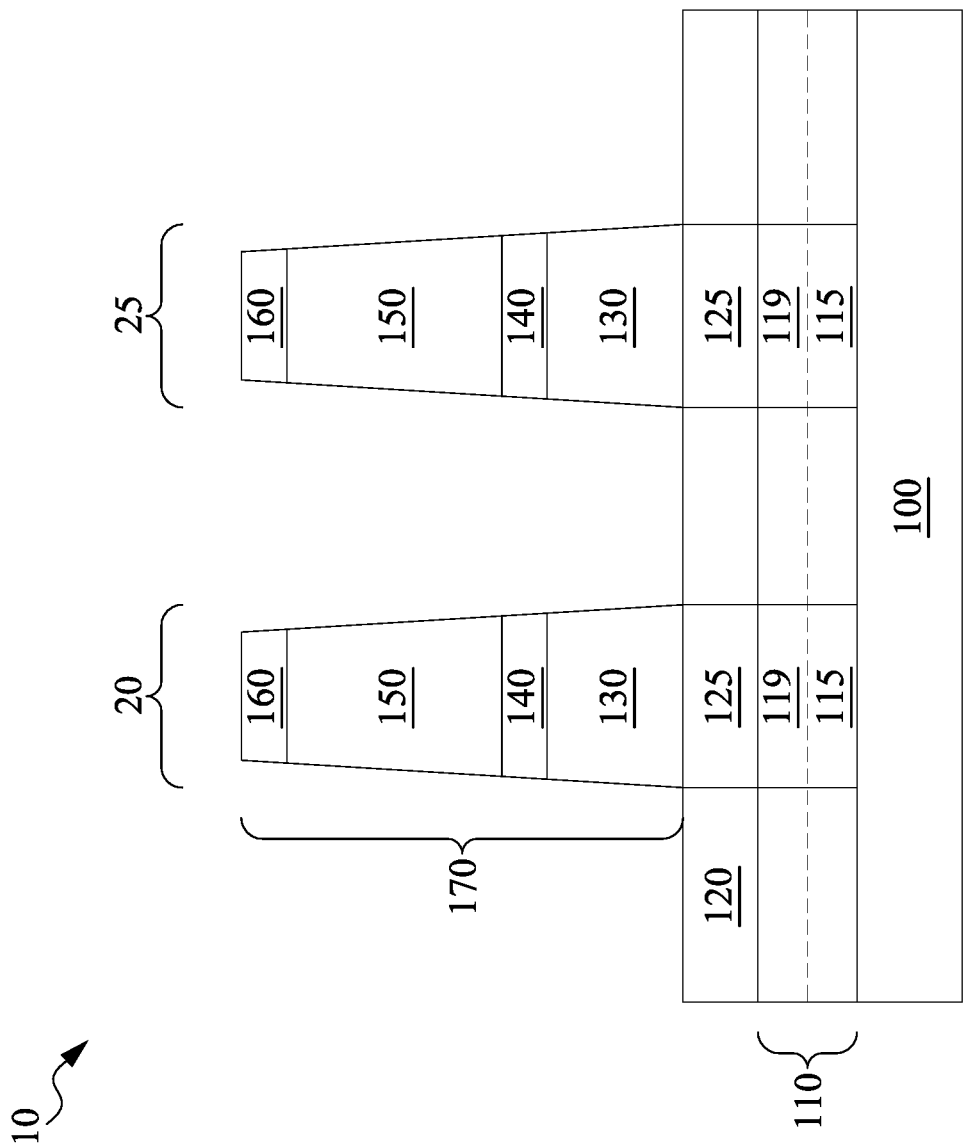

In FIG. 10, each of the underlying layers is etched in successive etch steps to form the 1TJ-1MTJ pillars 170 corresponding to the MRAM cell 20 and MRAM cell 25 of MRAM device 10. The etching of each of the layers of the tunnel junction selector 150, hard mask 140, and MTJ structure 130 may be performed using a suitable etchant selective to the particular layer being etched. The etching technique may include reactive ion etching (RIE), ion beam etching (IBE), or the like. Etching may be performed using process gases selected from Cl$_2$, N$_2$, CH$_4$, He, CH$_x$F$_y$, SF$_6$, NF$_3$, BCl$_3$, O$_2$, Ar, C$_x$F$_y$, HBr, or the combinations thereof, depending on the particular material being etched. N$_2$, Ar and/or He may be used as carrier gases. For example, for etching titanium, titanium nitride, tantalum, tantalum nitride, or the like in hard mask layer 38, Cl$_2$ may be used, along with other gases such as the carrier gas.

Figure 11:
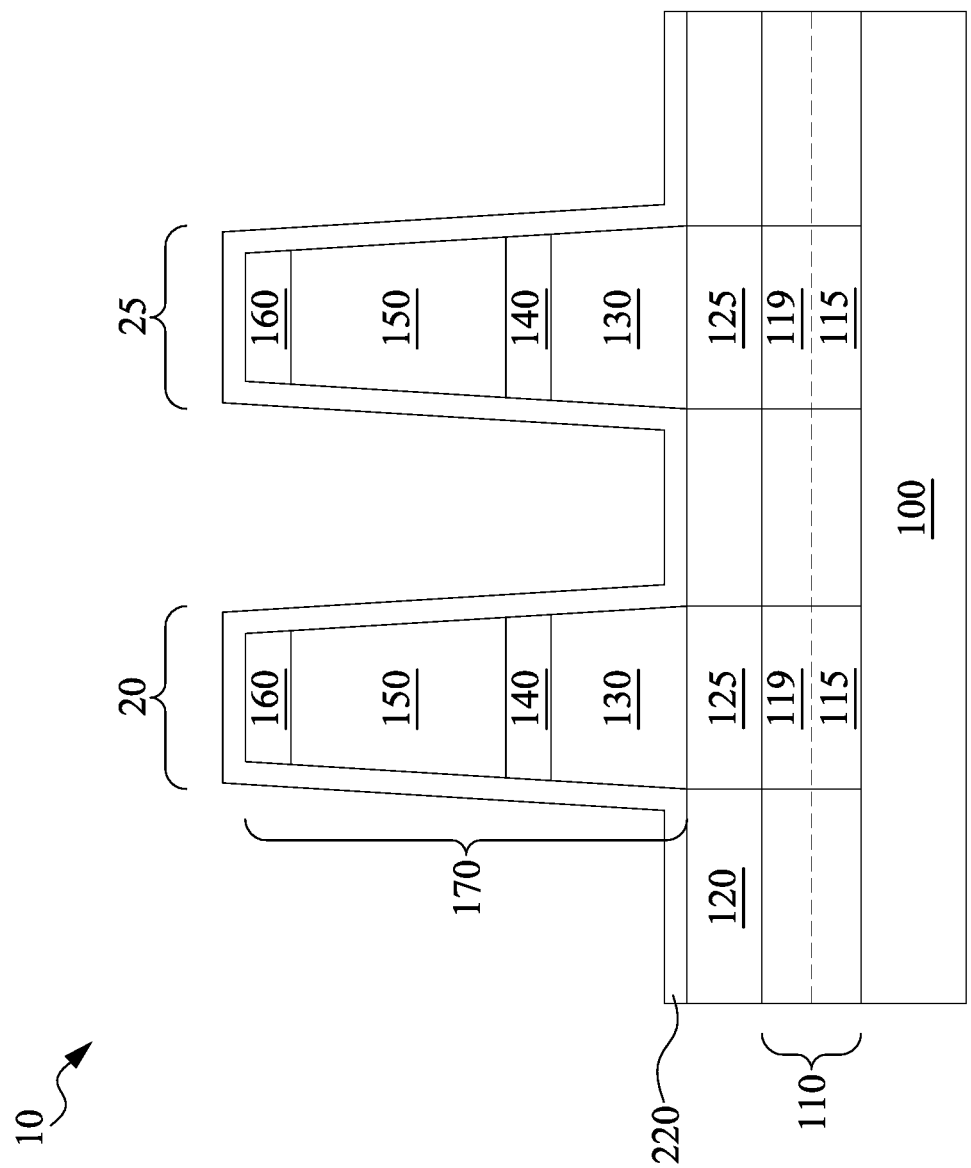
Figure 12:
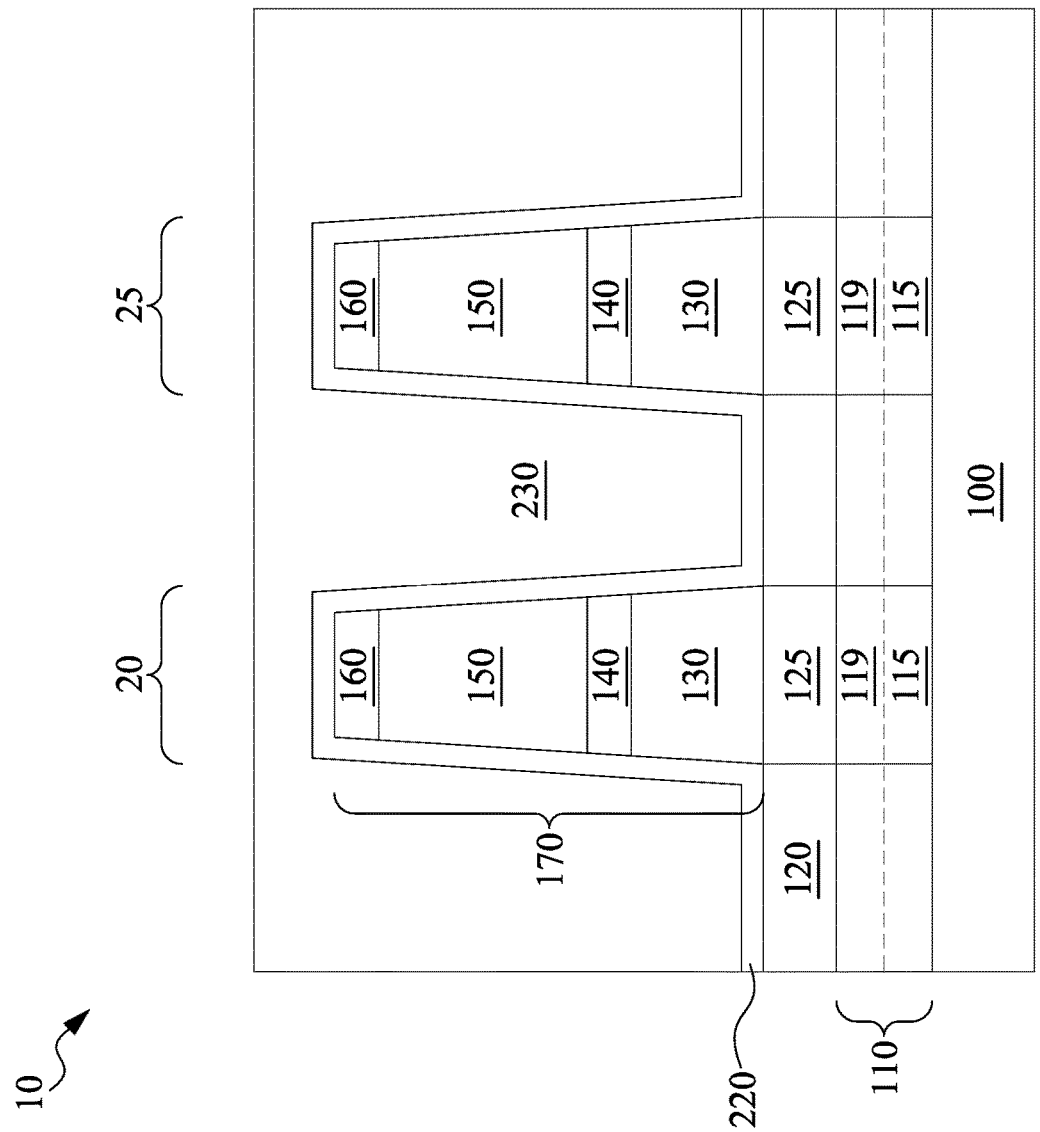

FIG. 11 illustrates the formation of dielectric capping layer 220 in accordance with some embodiments. In accordance with some embodiments, dielectric capping layer 220 is formed of silicon nitride, silicon oxynitride, or the like. The formation process may be a CVD process, an ALD process, a Plasma Enhance CVD (PECVD) process, or the like. Dielectric capping layer 220 may be formed as a conformal layer, FIG. 12 illustrates a gap-filling process, in which dielectric material 230 is filled into the gaps between the 1TJ-1MTJ pillars 170. Dielectric material 230 may be a TEOS formed oxide, PSG, BSG, BPSG, USG, FSG, SiOCH, flowable oxide, a porous oxide, or the like, or combinations thereof. Dielectric material 230 may also be formed of a low-k dielectric material. The formation method may include CVD, PECVD, ALD, FCVD, spin-on coating, or the like.

Figure 13:
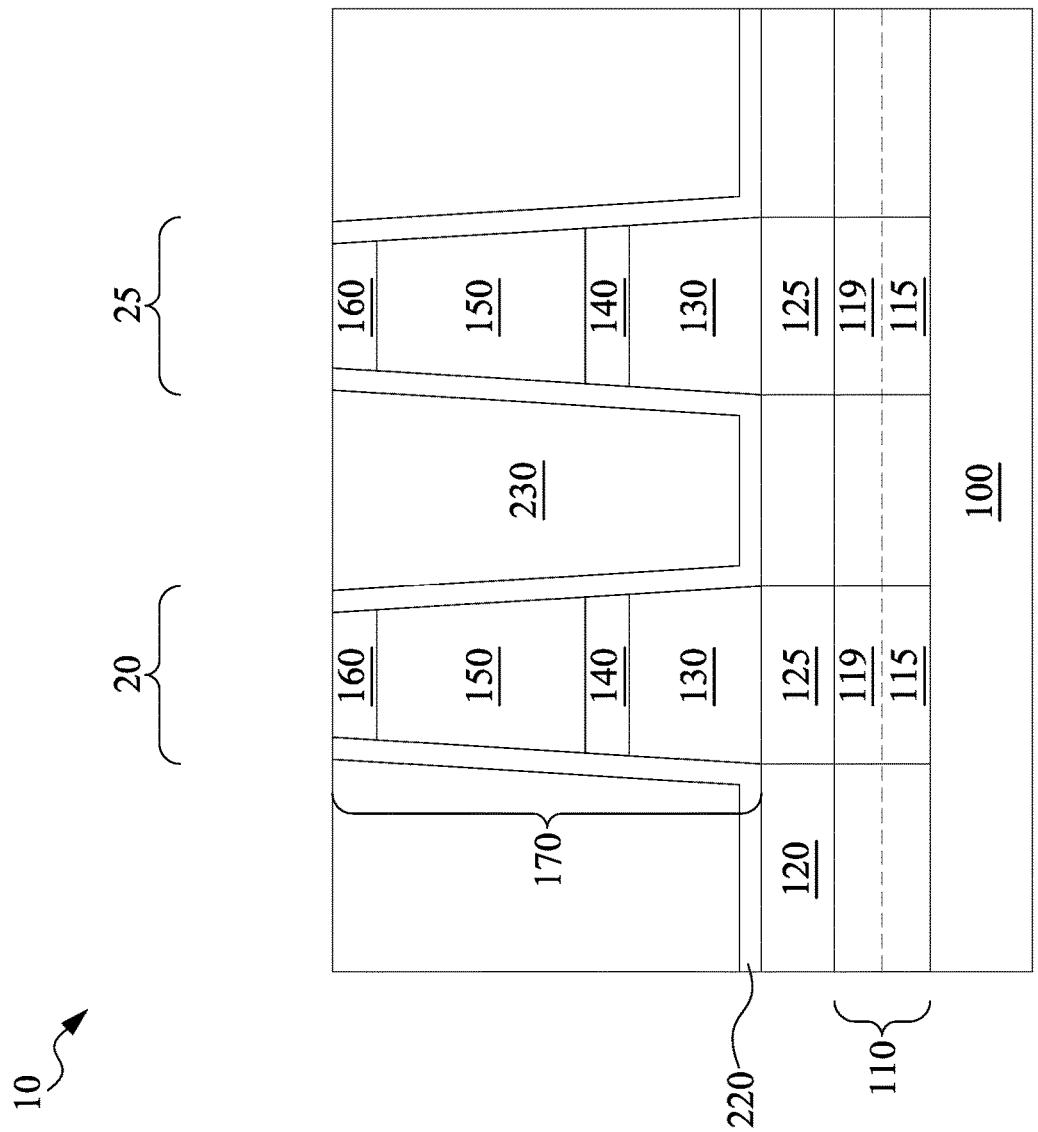

In FIG. 13, after the gap-filling process, a planarization process such as a CMP process or a mechanical grinding process may be performed. The planarization process may be performed using hard mask layer 160 as a CMP stop layer. Accordingly, the top surface of dielectric material 230 may be level with the top surface of hard mask 160. In other embodiments, the dielectric capping layer 220 or a top electrode layer 255 may be used as CMP stop layer. Embodiments where the dielectric capping layer 220 is used as the CMP stop layer are illustrated with respect to FIGS. 15-17, 22, and 35. Embodiments where the top electrode layer 255 is used as the CMP stop layer are illustrated with respect to FIG. 23.

Figure 14:
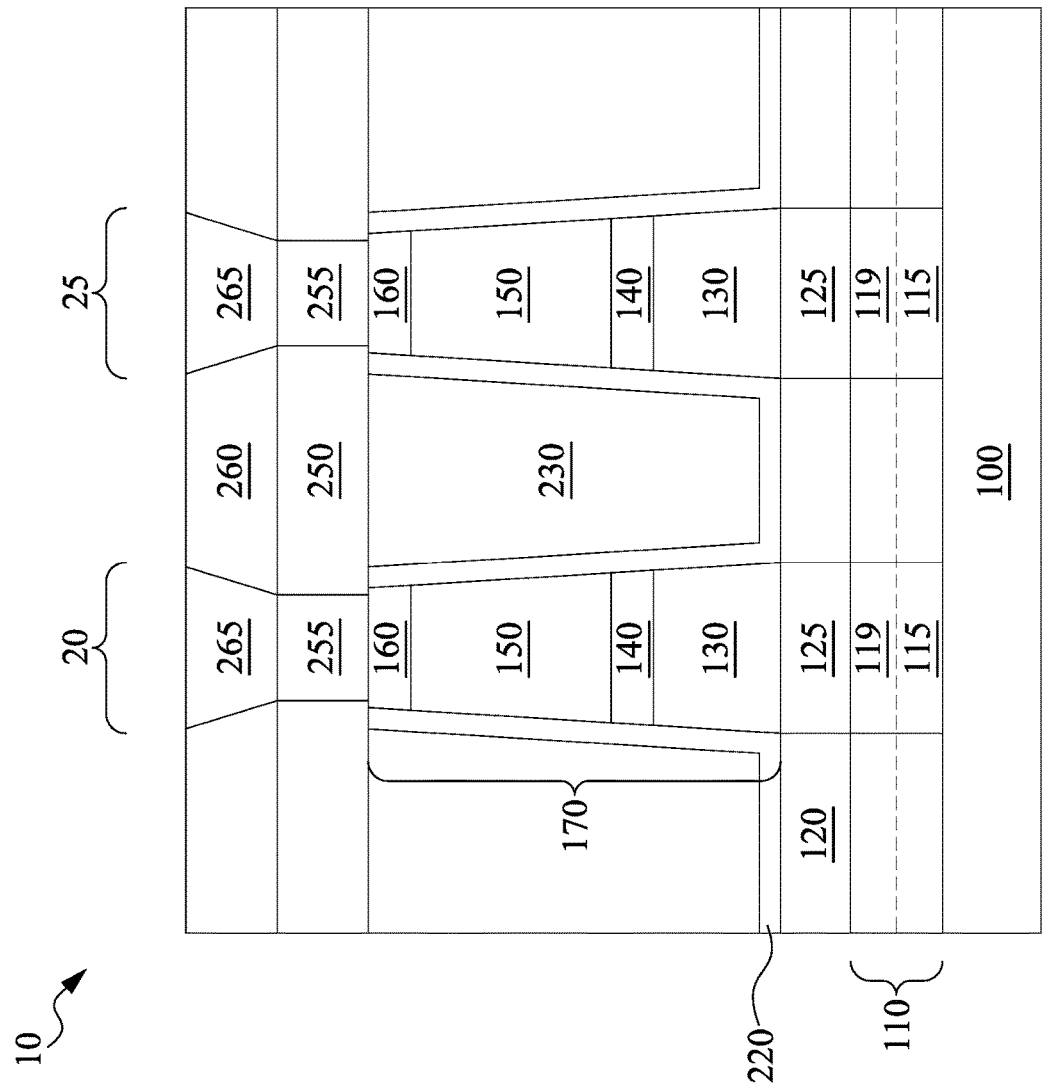

In FIG. 14, top electrodes 255 are formed and top electrode vias 265 are formed. The top electrodes 255 may be formed using processes and materials similar to the bottom electrodes 125 as discussed above with respect to FIG. 2 or bottom electrodes 125 discussed below with respect to FIG. 18. In particular, top electrodes 255 may be laterally surrounded by an insulating layer 250. Following the formation of the top electrodes 255, an insulating layer 260 may be deposited, openings formed therein to expose the top electrodes 255, and top electrode vias 265 deposited therein. The materials and processes used to form insulating layer 260 may include those discussed above with respect to insulating layer 117 of FIG. 1. Similarly, the materials and processes used to form the top electrode vias 265 may include those discussed above with respect to bottom electrode vias 119 of FIG. 1.

Following the formation of the top electrode vias 265, another redistribution structure may be formed over the top electrode vias 265 to couple MRAM cells together into arrays and provide inputs to the MRAM cells to bias the MRAM cells. The redistribution structure may be formed using processes and materials similar to those discussed above with respect to redistribution structure 110.

The resulting MRAM device 10 may include multiple MRAM cells, such as MRAM cell 20 and MRAM cell 25. The MRAM cell 20 and MRAM cell 25 may be connected in an array, so that their top or bottom electrodes are electrically coupled to each other. The MRAM cell 20 may also be connected to another MRAM cell (not shown) so that the other of the top or bottom electrode is coupled to the other MRAM cell.

Because the tunnel junction selector 150 is placed in series with the MTJ structure 130 in a single pillar, cell size of the MRAM cells may be decreased. As a result, the spacing between MRAM cells may also be decreased and the density of the MRAM device may increase. In some embodiments, the cell size may be less than $8F^2$, and may be between $6F^2$ and $4F^2$, inclusive.

FIGS. 15 through 17 include an illustration where the planarization process following FIG. 12 uses the dielectric capping layer 220 as CMP stop layer. FIG. 15 illustrates the flow following FIG. 12, where a planarization process removes a portion of the top surface of dielectric material 230 and levels the top surface of the dielectric material 230 with the top surface of the dielectric capping layer 220.

In FIG. 16, a patterning process may be used to form a mask 240 over the dielectric material 230 and create openings 241, removing by a suitable etching process a portion of the dielectric capping layer 220 over the hard mask 160 to expose the hard mask 160. The hard mask 160 may optionally also be removed. A portion of the dielectric capping layer 220 extends above the hard mask 160, which will partially surround the subsequently formed top electrodes 255.

In FIG. 17, top electrodes 255 may be formed using any suitable process. In some embodiments, one or more metal layers using materials such as those discussed above with respect to bottom electrodes 125 may be deposited. These materials may then be removed as needed to keep the portion of the top electrodes 255 aligned with each of the 1TJ-1MTJ pillars 170. Then, an insulating layer 250 may be formed around the top electrodes 255 to laterally encapsulate the top electrodes 255. The insulating layer 250 may be formed using processes and materials such as discussed above with respect to the insulating layer 120. In another embodiment, the insulating layer 250 may be formed as a layer, then openings formed therein corresponding to the top electrodes 255. In such embodiments, the mask 240 of FIG. 16, may be formed over the insulating layer 250 with openings 241 extending through the insulating layer 250 and dielectric capping layer 220. Then, the top electrodes 255 may subsequently be formed in the openings 241. After the top electrodes 255 and insulating layer 250 are formed, they may be planarized by a grinding or CMP process to level the top surface of the top electrodes 255 with the top surface of the insulating layer 250.

Top electrode vias 265 may be formed using processes and materials similar to those discussed above with respect to FIG. 14. Following the formation of the top electrode vias 265, another redistribution structure may be formed over the top electrode vias 265 to couple MRAM cells together into arrays and provide inputs to the MRAM cells to bias the MRAM cells. The redistribution structure may be formed using processes and materials similar to those discussed above with respect to redistribution structure 110.

FIGS. 18 through 23 illustrate certain intermediate stages in the formation of a MRAM device 10, in accordance with some embodiments. In these described embodiments, one or both of the bottom electrode 125 or top electrode 255 may be formed as a layer extending across the lateral extents of the work area, such as the lateral extents of the substrate 100 or the lateral extents of the layer immediately underneath the bottom electrode 125 or top electrode 255.

Figure 18:
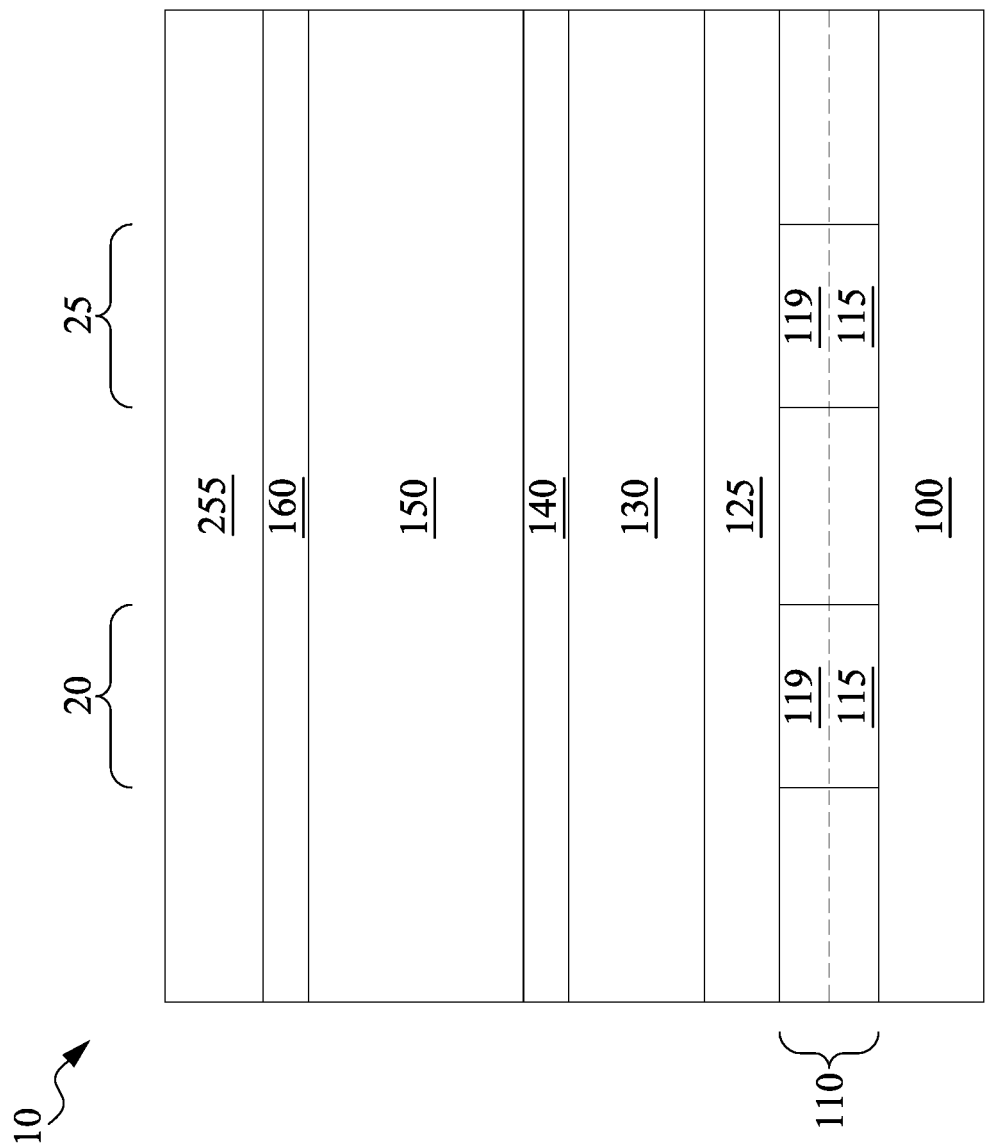
FIGS. 18 through 23 illustrate intermediate steps in the formation of embodiments of an MRAM cell with electrodes included in a pillar of the MRAM cell, in accordance with some embodiments.

The intermediate process illustrated of FIG. 18 follows that of FIG. 8 as discussed above. As illustrated in FIG. 18, however, the bottom electrode 125 is formed as one or more layers which are patterned in a later patterning process. Each of the one or more layers of the bottom electrodes 125 may be formed using any suitable materials and processes, including materials and processes similar to those discussed above with respect to the bottom electrodes 125 of FIG. 2. The one or more layers of the bottom electrodes 125 may extend to the lateral extents of the redistribution structure 110 and lateral extents of the substrate 100.

In FIG. 18, one or more layers for the top electrodes 255 are formed over the hard mask 160. The one or more layers for the top electrodes 255 may be formed using any suitable processes and materials, including those used for the formation of the one or more layers of the bottom electrodes 125.

Figure 19:
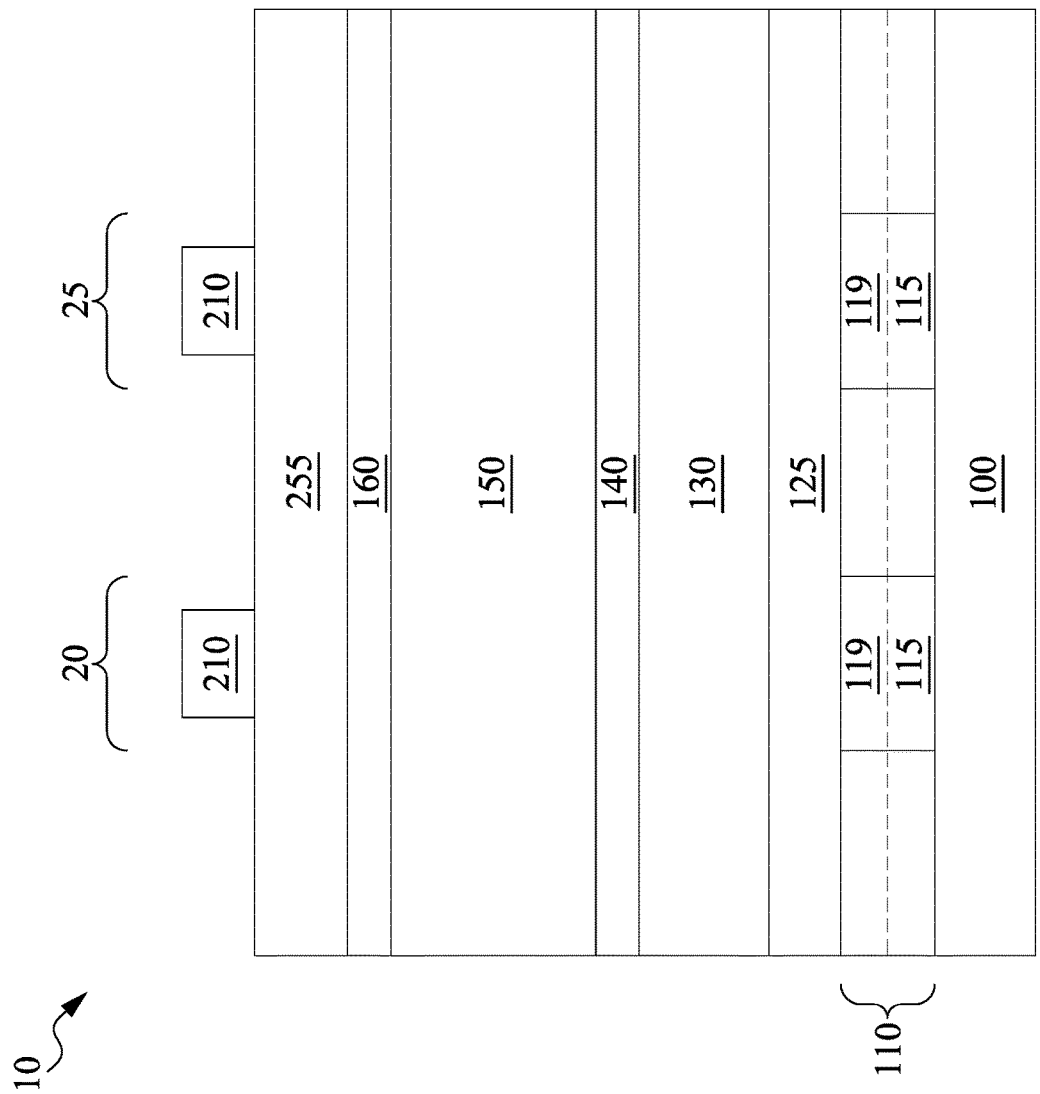

In FIG. 19, a mask 210 is formed over the one or more layers for the top electrodes 255 and patterned to protect the areas of the underlying layers which will form the 1TJ-MTJ pillars of MRAM device 10.

Figure 20:
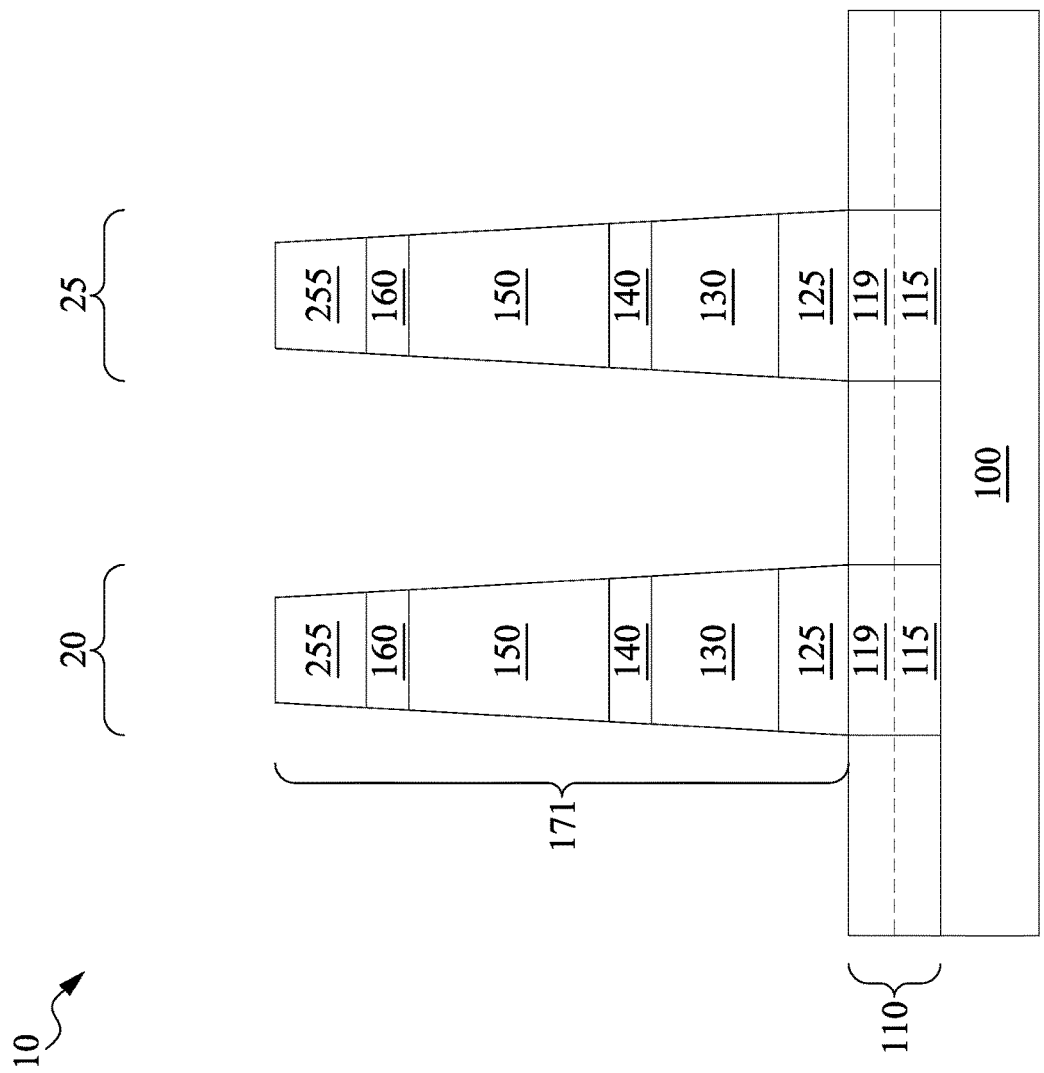

In FIG. 20, the 1TJ-MTJ pillars 171 are formed by an etching process using mask 210 as an etch mask. Each of the layers is etched in turn using a suitable etching process and materials, such as those discussed above with respect to FIG. 10.

Figure 21:
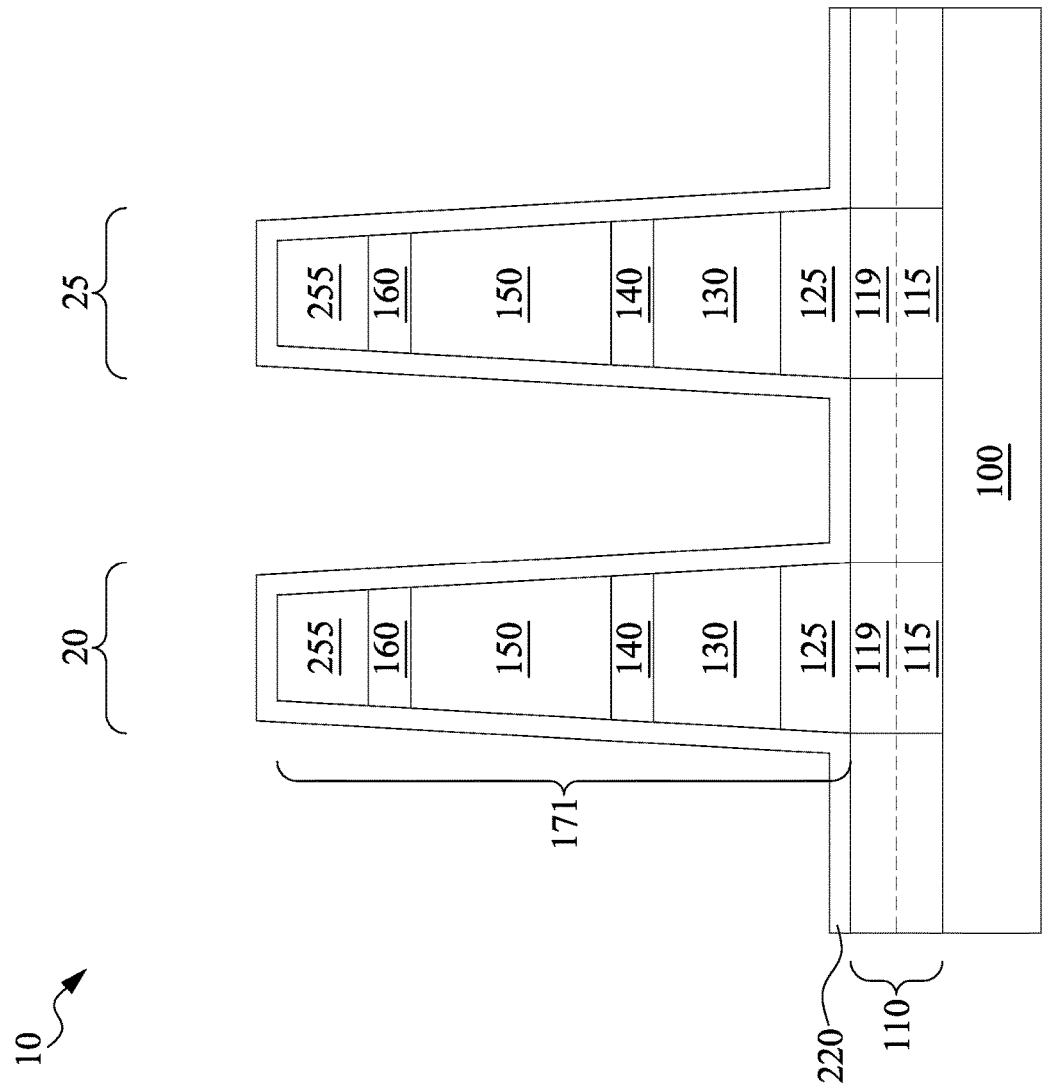

In FIG. 21, the dielectric capping layer 220 is formed over the 1TJ-MTJ pillars 171 using processes and materials similar to those discussed above with respect to FIG. 11.

Here, however, the dielectric capping layer 220 extends along sides of the bottom electrodes 125 and top electrodes 255.

Figure 22:
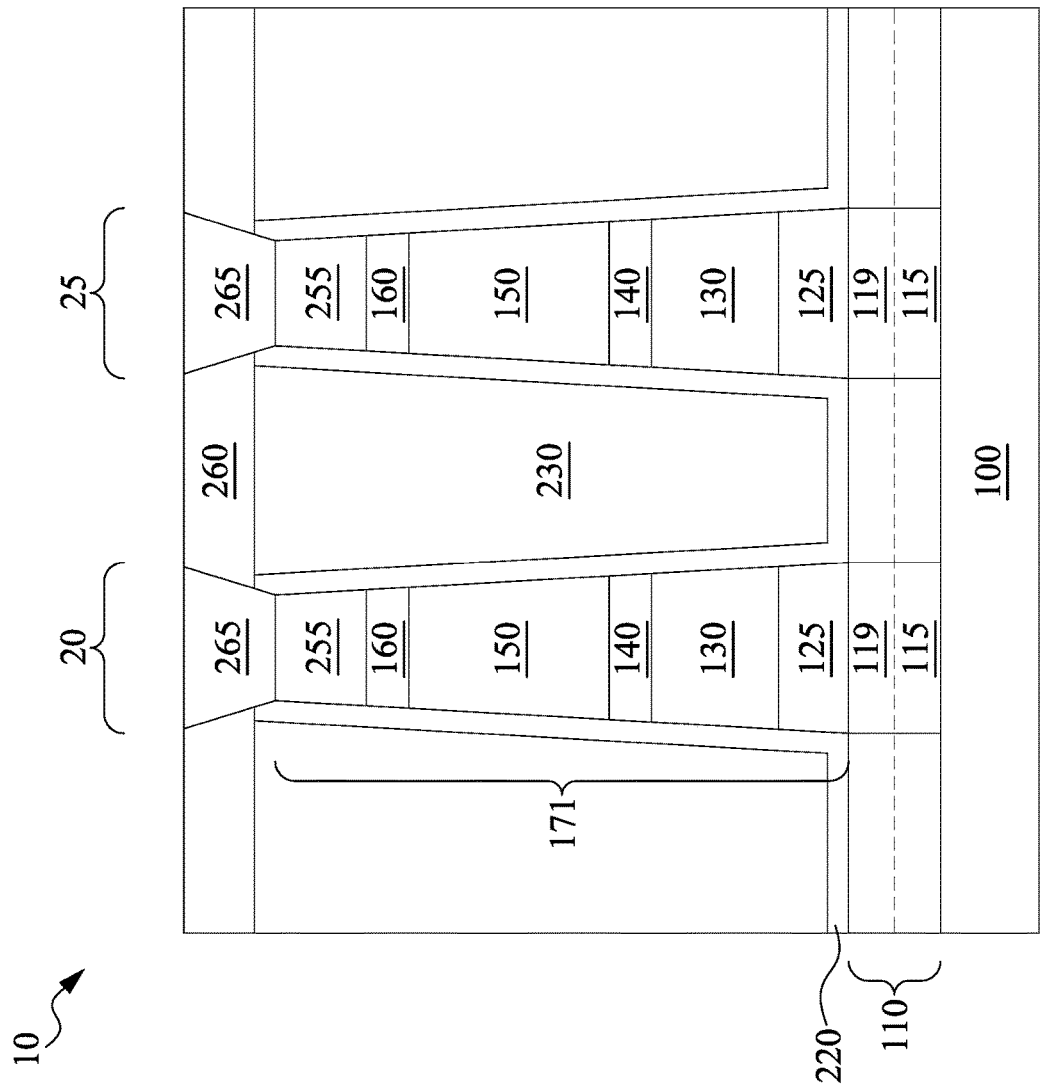

In FIG. 22, a gap-filling process is used to deposit dielectric material 230 over and in the gaps between the 1TJ-MTJ pillars 171. Dielectric material 230 may be formed using any suitable processes and materials, including those discussed above with respect to the dielectric material 230 described above with respect to FIG. 12. Following the deposition of the dielectric material 230, a planarization process, such as a CMP process or grinding process may level the top surface of the dielectric material 230 with the top surface of the dielectric capping layer 220 (or top surface of the top electrode 255 as shown in FIG. 23).

Top electrode vias 265 are then formed. An insulating layer 260 may be deposited over the dielectric material 230 and patterned to form openings over the top electrodes 255. Top electrode vias 265 may be formed in the openings. The insulating layer 260 and top electrode vias 265 may be formed using any suitable processes and materials, including those discussed above with respect to insulating layer 117 and bottom electrode vias 119 of FIG. 1. As illustrated in FIG. 22, the top electrode vias 265 are partially surrounded by the dielectric capping layer 220, as they extend through a neck of the dielectric capping layer 220.

Figure 23:
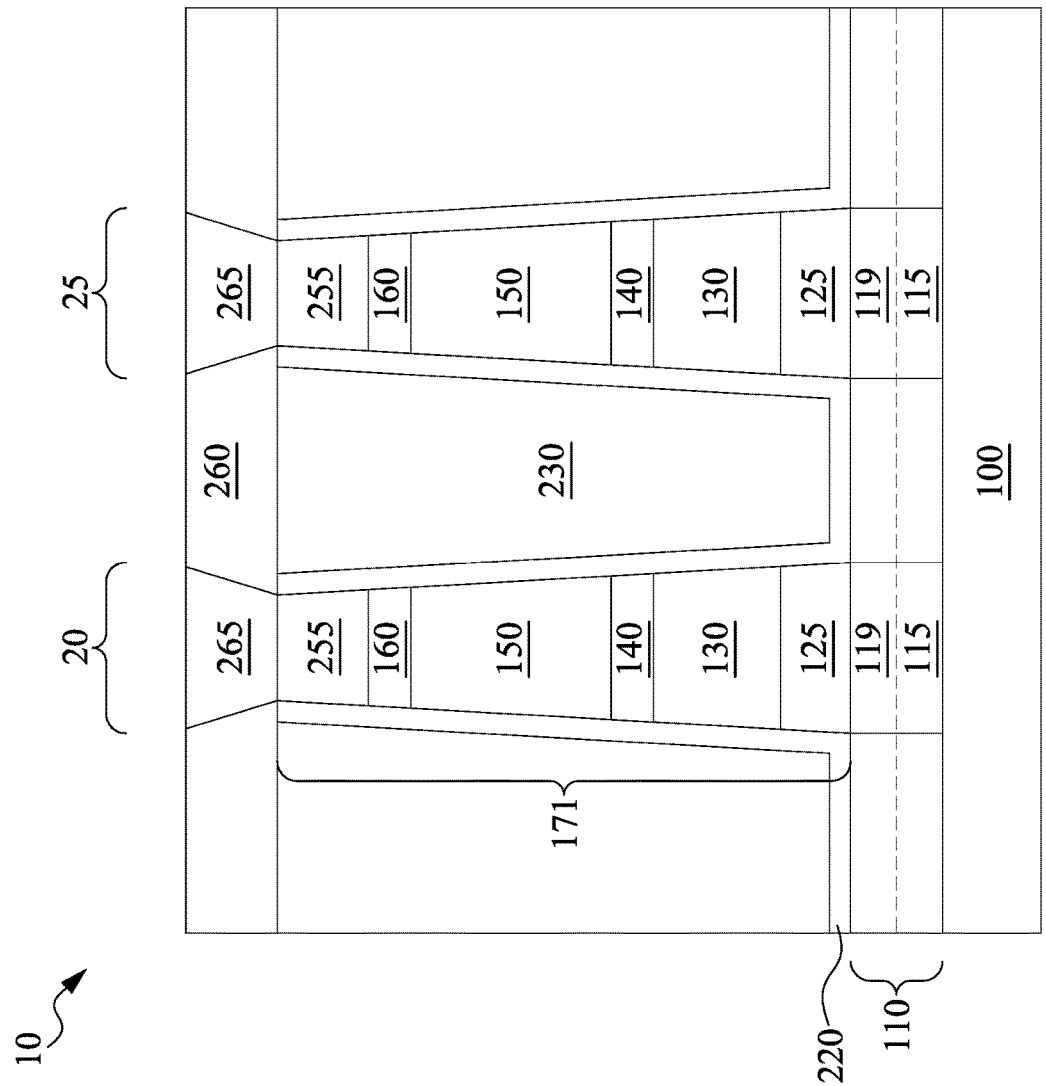

FIG. 23 illustrates that the planarization process after the gap-fill process depositing the dielectric material 230 uses the top electrode 255 as CMP stop, so that the top surface of the dielectric material 230 is level with the top surface of the top electrodes 255. Next, the insulating layer 260 and top electrode vias 265 may be formed using any suitable processes and materials, including those discussed above with respect to insulating layer 117 and bottom electrode vias 119 of FIG. 1. As illustrated in FIG. 23, the bottoms of the top electrode vias 265 are also level with the top of the dielectric capping layer 220.

Following the formation of the top electrode vias 265, another redistribution structure may be formed over the top electrode vias 265 to couple MRAM cells together into arrays and provide inputs to the MRAM cells to bias the MRAM cells. The redistribution structure may be formed using processes and materials similar to those discussed above with respect to redistribution structure 110.

Figure 26:
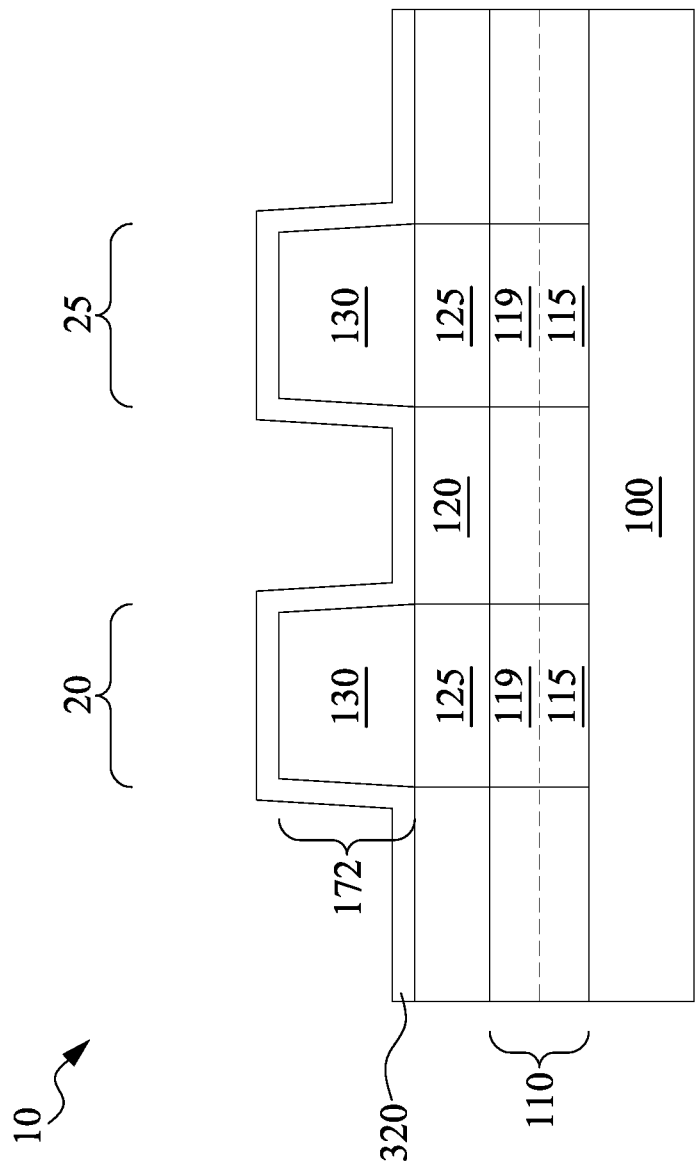
Figure 27:
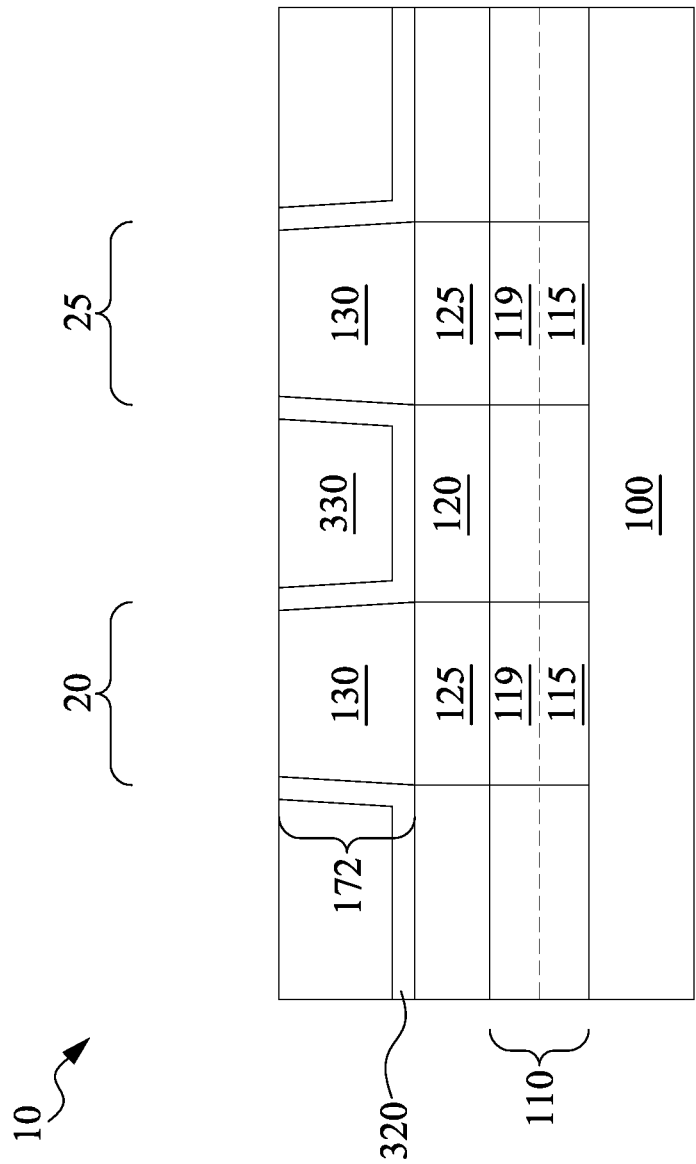
Figure 28:
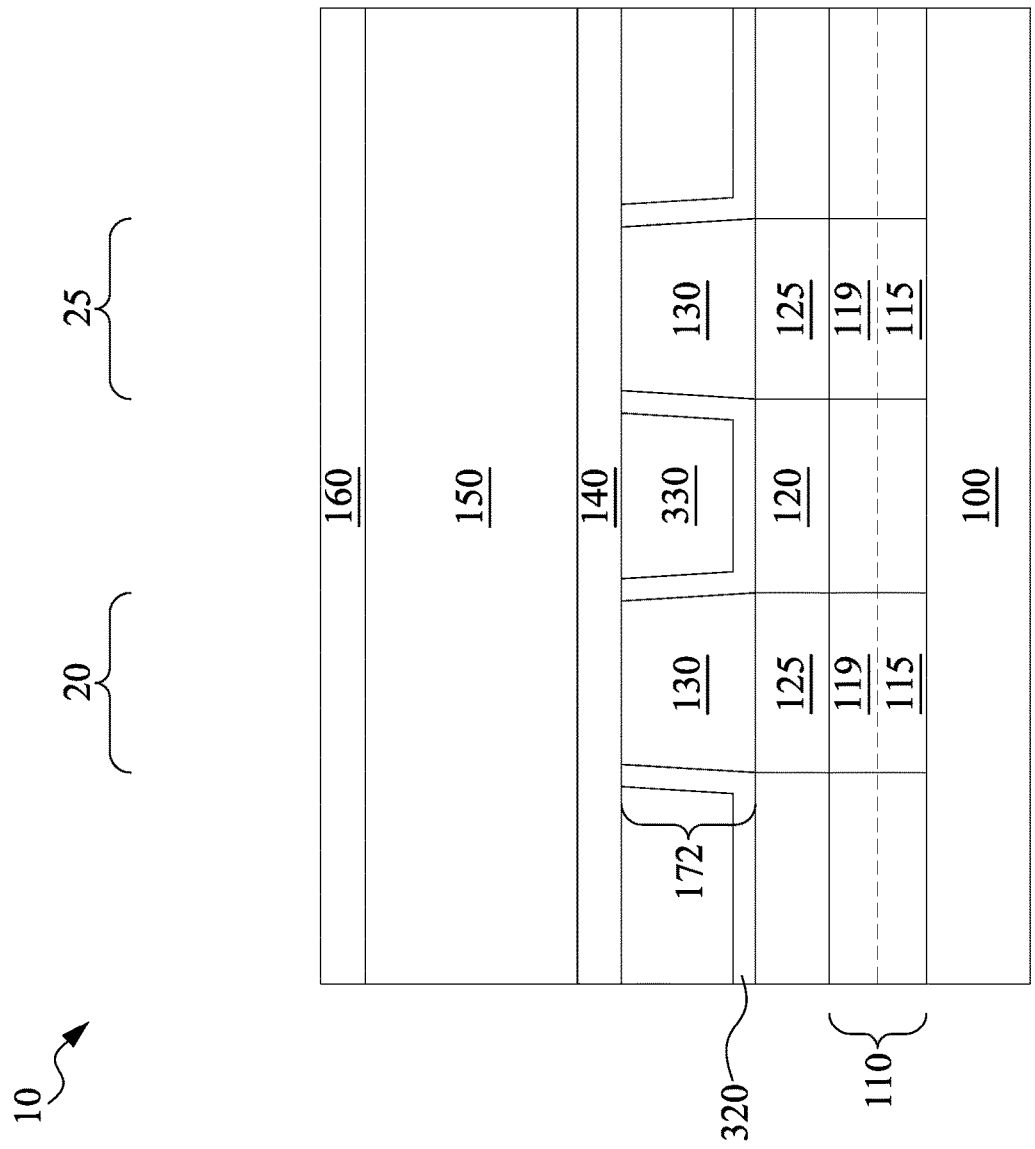

FIGS. 24 through 34 illustrate embodiments where the MTJ structure 130 is patterned to form MTJ pillars 172 (see FIG. 25) prior to forming the tunnel junction selector 150 (see FIG. 28).

Figure 24:
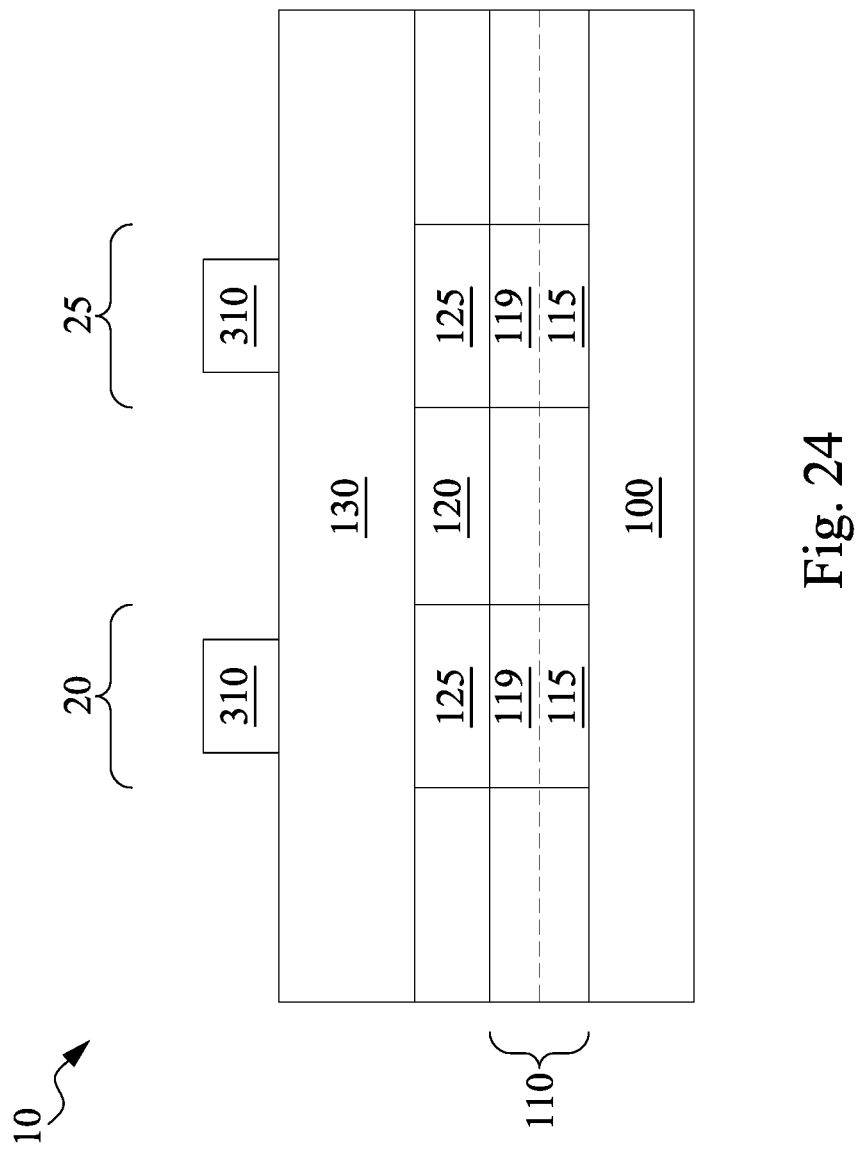
FIGS. 24 through 34 illustrate intermediate steps in the formation of embodiments of an MRAM cell using two pillar formation steps, in accordance with some embodiments.

FIG. 24 picks up in the process described above after FIG. 3 or after FIG. 5, in other words, after the formation of the MTJ structure 130. Optionally, the hard mask 140 may also be formed, and although it is not illustrated in FIG. 24, the formation and patterning of hard mask 140 is illustrated and described above.

Figure 25:
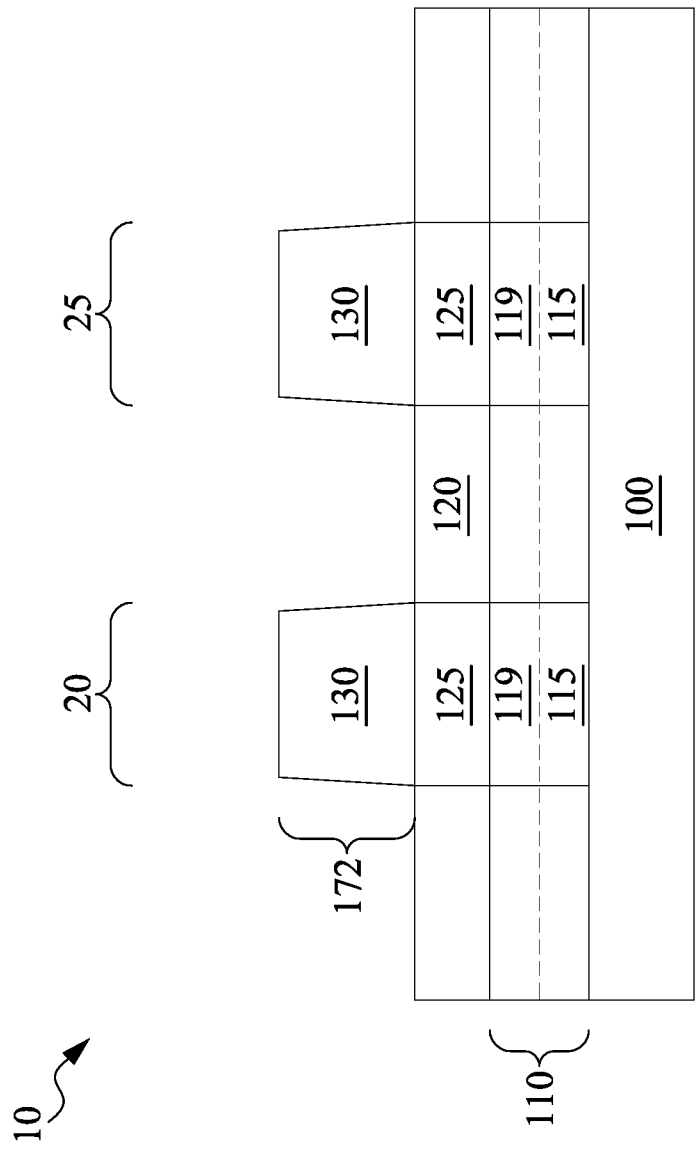

In FIG. 24 a mask layer 310 is formed over the MTJ structure 130 to protect areas of the MTJ structure 130 which are formed into MTJ pillars 172 (see FIG. 25). The mask layer 310 may be formed and patterned using any acceptable process, such as a photo patterning process. In some embodiments, the mask layer 310 may be a photo patternable material, while in other embodiments, the mask layer 310 may be an oxide or nitride which is patterned using a photo-patternable material, which is subsequently removed.

In FIG. 25, the mask layer 310 is used to pattern the MTJ structure 130 to form MTJ pillars 172. The MTJ pillars 172 can be patterned using any suitable processes and materials, including processes and materials described above with respect to the patterning of the 1TJ-1MTJ pillars 170 of FIG. 10.

In FIG. 26, a dielectric capping layer 320 is formed over the MTJ pillars 172. The dielectric capping layer 320 may be formed using any suitable materials and processes, including the materials and processes described above with respect to the formation of the dielectric capping layer 220 of FIG. 11.

In FIG. 27, a gap-fill process is used to deposit the dielectric material 330 in the gaps between MTJ pillars 172. The gap-fill process may use any suitable processes and materials, including the processes and materials described above with respect to the formation of the dielectric material 230 of FIG. 12. The gap-fill process may cause the dielectric capping layer 320 to extend over the MTJ pillars 172. A planarization process, such as a CMP process or grinding, may be used to level the top surface of the dielectric material 330 with the tops of the MTJ pillars 172. In embodiments which include the hard mask 140, the top surface of the hard mask 140 may be used as a CMP stop for the planarization process, so that the top surface of the dielectric material 330 is level with the top surface of the hard mask 140.

In FIG. 28, if not already formed, the hard mask 140 may be formed over the dielectric material 330 and the MTJ pillars 172. In some embodiments, using the hard mask 140 in the patterning of the MTJ pillars 172, the hard mask 140 may have suffered damage. In such embodiments, the hard mask 140 may be removed and reformed, or an additional hard mask 140 may be over the damaged hard mask layer to restore it.

After the formation of the hard mask 140, the tunnel junction selector 150 may be formed over the hard mask 140. Following the formation of the tunnel junction selector 150, the hard mask 160 may be formed over the tunnel junction selector 150.

The hard mask 140, tunnel junction selector 150, and hard mask 160 may be formed using processes and materials similar to those discussed above with respect to their respective counterparts in FIGS. 5 through 8.

Figure 29:
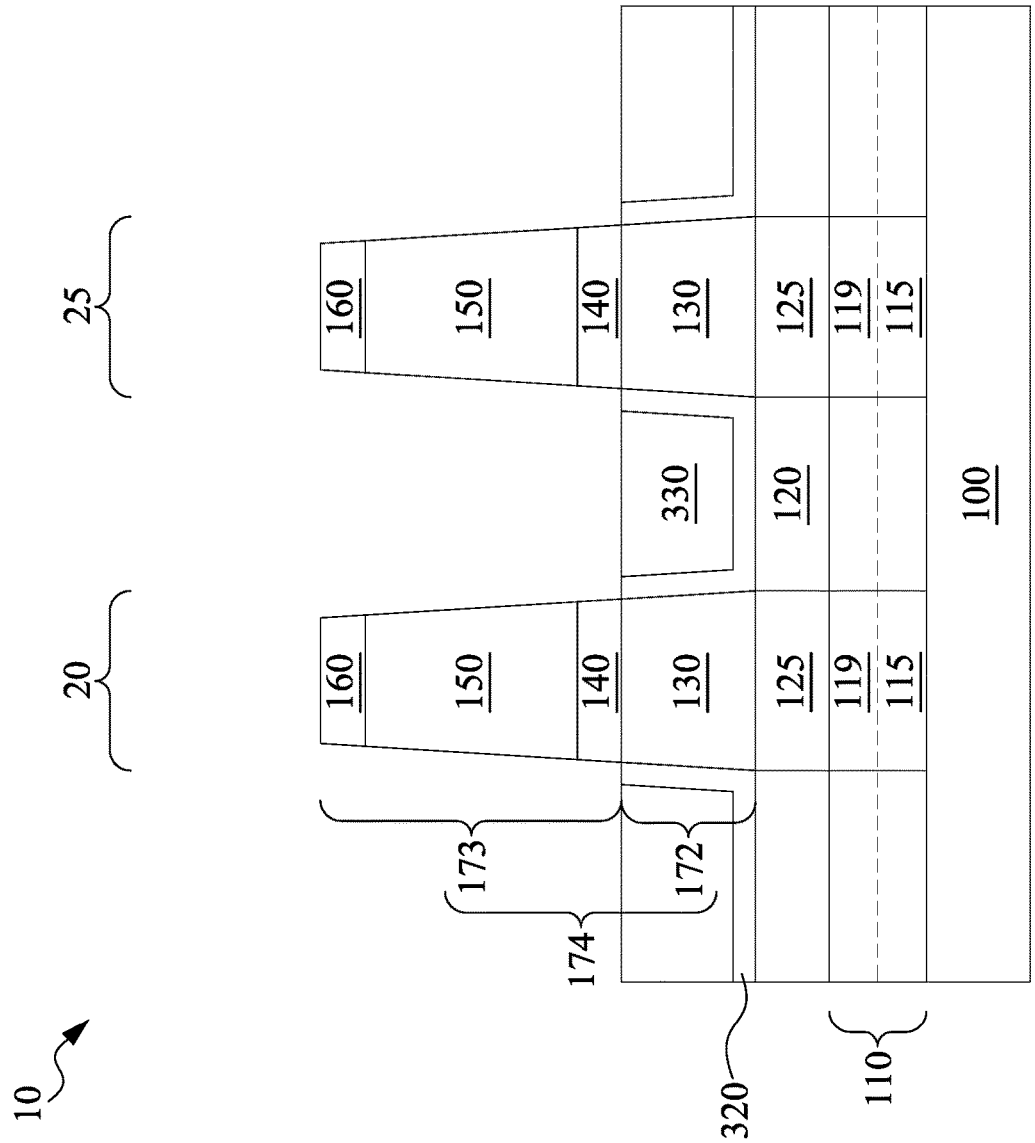

In FIG. 29, in another patterning process, the tunnel junction selector 150 may be patterned to form TJ pillars 173 for each of the MRAM cells, such as MRAM cells 20 and 25. The TJ pillars 173 can be patterned using any suitable processes and materials, including processes and materials described above with respect to the patterning of the 1TJ-1MTJ pillars 170 of FIG. 10. In particular, a mask layer may be formed over the pillars to be patterned to protect them from the patterning process.

Figure 30:
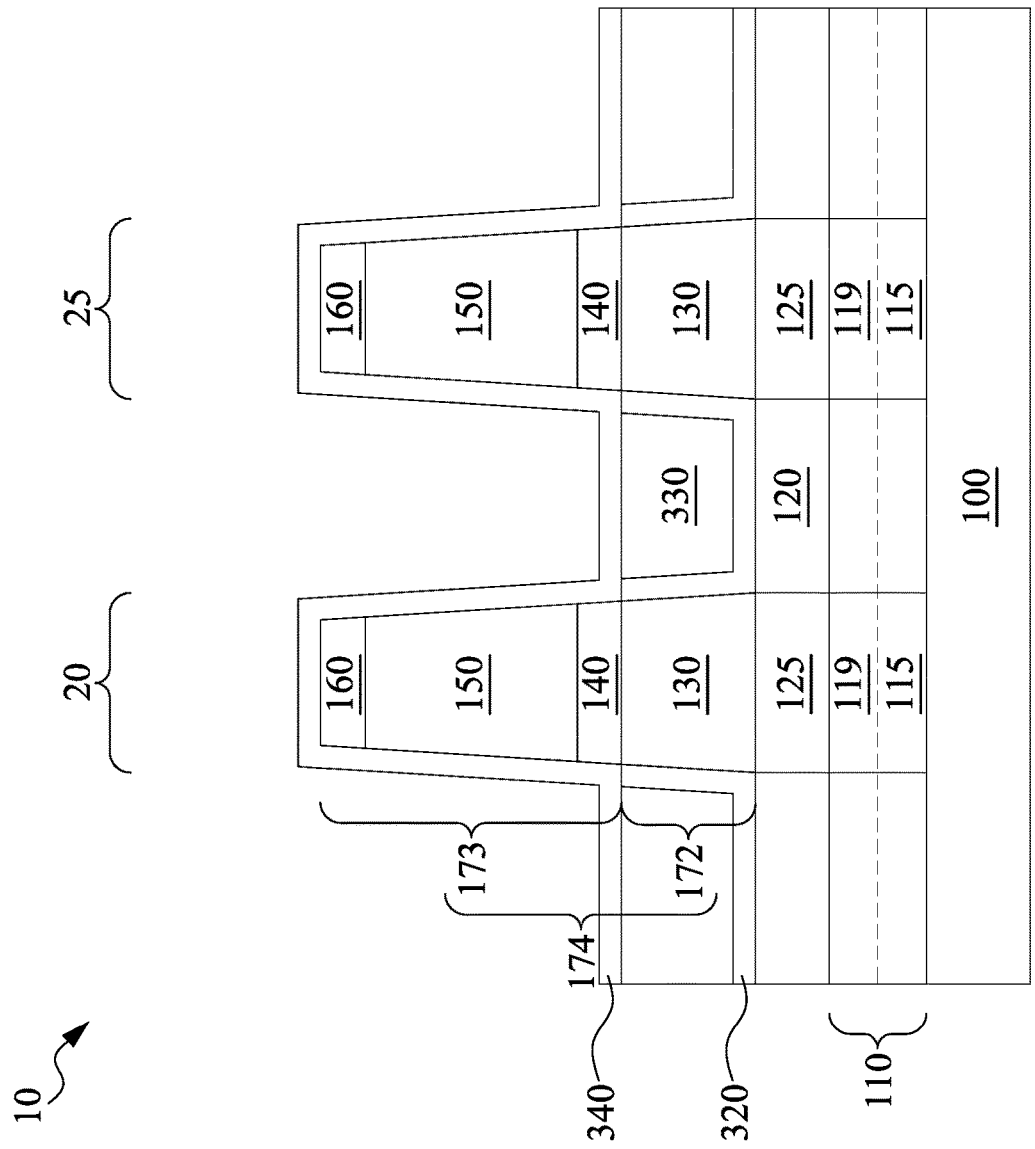

In FIG. 30, a capping dielectric layer 340 is deposited over the TJ pillars 173. The capping dielectric layer 340 may be formed using any suitable materials and processes, including the materials and processes described above with respect to the formation of the dielectric capping layer 220 of FIG. 11.

Figure 31:
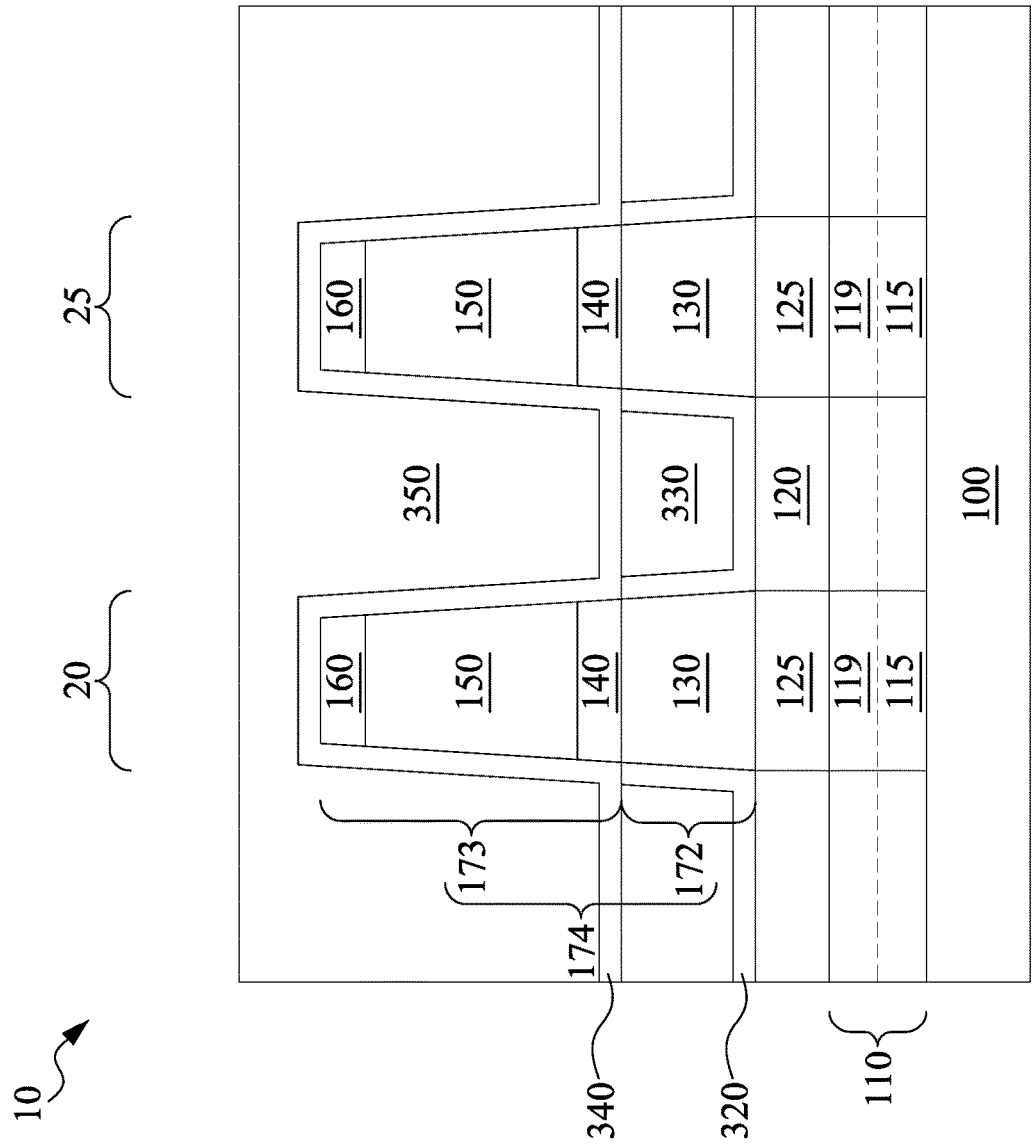

In FIG. 31, a gap-fill process is used to deposit a dielectric material 350 in the gaps between TJ pillars 173. The gap-fill process may use any suitable processes and materials, including the processes and materials described above with respect to the formation of the dielectric material 230 of FIG. 12. The gap-fill process may cause the dielectric material 350 to extend over the TJ pillars 173.

Figure 32:
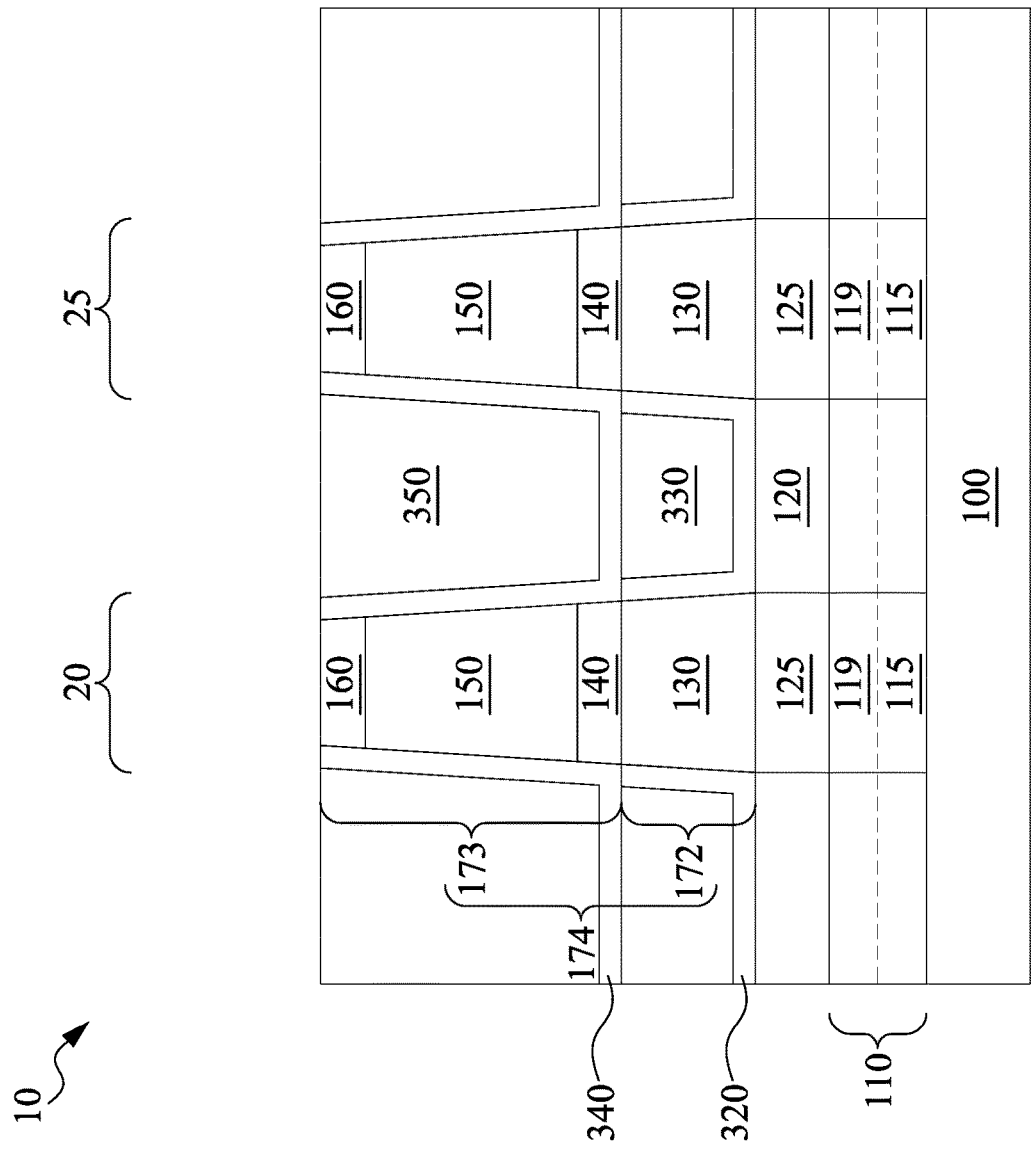

In FIG. 32, a planarization process, such as a CMP process or grinding, may be used to level the top surface of the dielectric material 350 with the tops of the TJ pillars 173. In some embodiments, the hard mask 160 may be used as a CMP stop so that the top surface of the hard mask 160 is level with the top surface of the dielectric material 350. In other embodiments, the capping dielectric layer 340 may be used as the CMP stop, while in yet other embodiments, a top electrode may be used as a CMP stop, so that each of these respective CMP stops has a top surface level with the top surface of the dielectric material 350.

Figure 33:
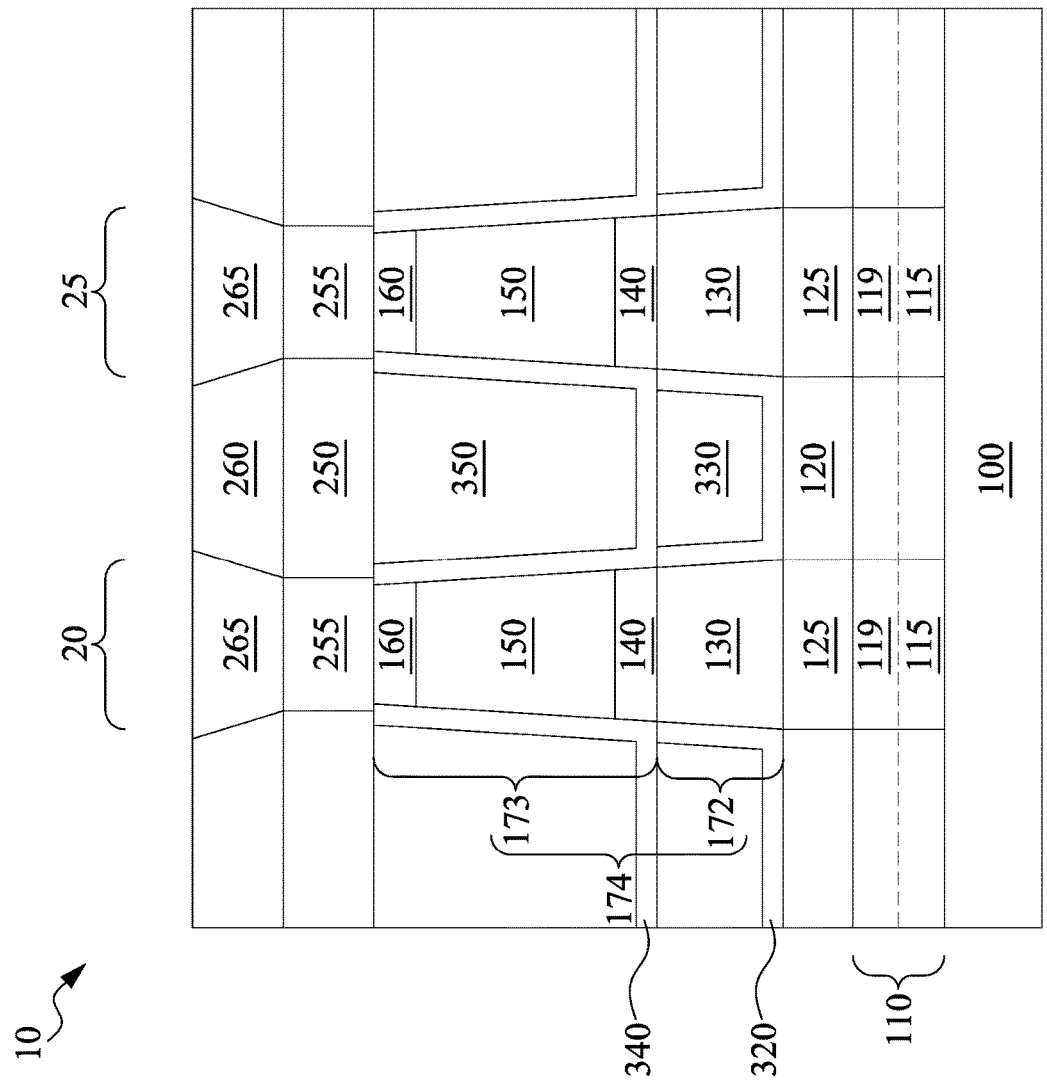

In FIG. 33, top electrodes 255 may be formed followed by top electrode vias 265. The top electrodes 255 may be laterally encapsulated in insulating layer 250 and the top electrode vias 265 may be laterally encapsulated in insulating layer 260. The top electrodes 255, top electrode vias 265, insulating layer 250, and insulating layer 260 may be formed using materials and processes such as those described above with respect to their respective counterparts in FIG. 14.

Following the formation of the top electrode vias 265, another redistribution structure may be formed over the top electrode vias 265 to couple MRAM cells together into arrays and provide inputs to the MRAM cells to bias the MRAM cells. The redistribution structure may be formed using processes and materials similar to those discussed above with respect to redistribution structure 110.

In FIG. 34, embodiments are illustrated which include patterning the bottom electrode 125 along with the MTJ pillar 172'. Similarly, FIG. 34 also illustrates embodiments which include patterning the top electrode 255 along with the MTJ pillar 173', so that the 1TJ-1MTJ pillar 174' includes both the MTJ pillar 172' and TJ pillar 173'. The formation of the bottom electrode 125 and/or top electrode 255 in this manner may be performed using materials and processes discussed above with respect to their respective counterparts in FIG. 22.

One should understand that the described embodiments may be mixed so that the formation of the bottom electrode 125 is, for example, consistent with embodiments illustrated in FIG. 34, while the top electrode 255 is, for example, consistent with embodiments illustrated in FIG. 23 or 33, and vice versa.

In FIG. 35, the structure of FIG. 14 is illustrated, except that the order of forming the tunnel junction selector 150 and the MTJ structure 130 is reversed so that the MTJ structure 130 is over the tunnel junction selector 150. One will understand that the MTJ structure 130 and the tunnel junction selector 150 may be formed in either order for any of the embodiments discussed above.

Embodiments provide a bipolar tunnel junction selector in line with a MTJ structure to provide the ability to set the MTJ structure into parallel or anti-parallel mode. The tunnel junction selector uses MgO as the material of the tunnel barrier, thereby providing robust operation and ease of manufacture with materials and processes which are compatible with MRAM and CMOS devices. In the tunnel junction selector, an insulating interlayer can be disposed between the tunnel barrier and the top contact and/or between the tunnel barrier and the bottom contact, to promote non-linearity of the IV curve. Advantages also include reducing the complexity of the MRAM device by eliminating an access transistor and other circuit logic to support switching the access transistor, thereby reducing MRAM cell size.

One embodiment is a device including a first magnetoresistive random access memory (MRAM) cell including a bottom electrode, a magnetic tunnel junction structure, a bipolar selector including a tunnel junction, and a top electrode. In an embodiment, the bipolar selector includes a bottom contact layer, a tunnel junction layer including MgO, and a top contact layer. In an embodiment, the bottom contact layer or top contact layer includes: tantalum, tungsten, chromium, ruthenium, molybdenum, silicon, germanium, or a non-magnetic alloy of CoFeB. In an embodiment, the bottom contact layer and the top contact layer share a same crystallinity as the tunnel junction layer. In an embodiment, the tunnel junction layer has a thickness between 0.5 nm and 5 nm. In an embodiment, the bipolar selector includes a bottom contact layer, a tunnel junction layer, a first interlayer interposed between the bottom contact layer and the tunnel junction layer, and a top contact layer. In an embodiment, the first interlayer includes an oxide. In an embodiment, the bottom contact layer includes a first material, and the first interlayer is an oxide of the first material. In an embodiment, bipolar selector of the device further includes a second interlayer interposed between the top contact layer and the tunnel junction layer.

Another embodiment is a device including a first memory cell, the first memory cell including a magnetic tunnel junction disposed in a first pillar, a bipolar selector disposed in the first pillar, where the bipolar tunnel junction selector includes a tunnel junction Schottky barrier, a top electrode over the first pillar, and a bottom electrode under the first pillar. The device includes a second memory cell connected with the first memory cell by the top electrode. The device also includes a third memory cell connected with the first memory cell by the bottom electrode. A dielectric material fill laterally surrounds the first pillar. In an embodiment, the bipolar selector includes a bottom contact, a first interlayer on the bottom contact, a tunnel layer including MgO with a thickness between 0.5 nm and 5 nm on the first interlayer, a second interlayer on the tunnel layer; and a top contact on the second interlayer. In an embodiment, the top contact and bottom contact have the same crystalline structure as the tunnel layer. In an embodiment, the first interlayer and the second interlayer include different material compositions. In an embodiment, the first interlayer and second interlayer are each between 1 nm and 5 nm thick.

Another embodiment is a method including depositing a bottom electrode layer over a substrate. A magnetic tunnel junction (MTJ) structure is formed over the bottom electrode layer. A bipolar selector is formed over the MTJ structure, the bipolar selector including a tunnel junction. A top electrode layer is deposited over the bipolar selector. A masking layer is patterned over the top electrode layer. Portions of the MTJ structure and portions of the bipolar selector are etched to form one or more pillars. A gap-fill material is deposited laterally surrounding a first pillar of the one or more pillars. In an embodiment, forming the bipolar selector includes depositing a bottom contact layer, depositing a tunnel junction layer, and depositing a top contact layer. In an embodiment, forming the bipolar selector further includes forming a first interlayer interposed between the bottom contact layer and the tunnel junction layer, and forming a second interlayer interposed between the top contact layer and the tunnel junction layer, the first interlayer including an oxide. In an embodiment, forming the first interlayer includes depositing a first material and oxidizing the first material by introducing oxygen into a chamber containing the first interlayer, depositing the first material and oxidizing the first material by scavenging oxygen atoms from the tunnel junction layer, or scavenging oxygen atoms from the tunnel junction layer to oxidize a portion of the bottom contact layer. In an embodiment, etching to form one or more pillars includes, prior to forming the bipolar selector, etching the MTJ structure to form a MTJ portion of the one or more pillars, the MTJ structure including the MTJ portion; and etching the portions of the bipolar selector to form a tunnel junction selector portion of the pillars, further including: forming a first dielectric capping layer over the MTJ portion of the one or more pillars, and forming a second dielectric capping layer over the tunnel junction selector portion of the pillars. In an embodiment, the method further includes etching the bottom electrode layer to form a bottom electrode after forming the top electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a magnetoresistive random access memory (MRAM) cell comprising:
a bottom electrode;
a magnetic tunnel junction structure electrically coupled to the bottom electrode;
a bipolar selector comprising a tunnel junction, the tunnel junction including a tunnel junction layer comprising MgO, the bipolar selector being aligned with the magnetic tunnel junction structure in a single pillar, the bipolar selector electrically coupled to the magnetic tunnel junction structure; and
a top electrode electrically coupled to the bipolar selector.

2. The device of claim 1, wherein the bipolar selector comprises:
a bottom contact layer; and
a top contact layer, the tunnel junction layer interposed between the bottom contact layer and the top contact layer.

3. The device of claim 2, wherein the bottom contact layer or top contact layer comprises: tantalum, tungsten, chromium, ruthenium, molybdenum, silicon, germanium, or a non-magnetic alloy of CoFeB.

4. The device of claim 2, wherein the bottom contact layer and the top contact layer share a same crystallinity as the tunnel junction layer.

5. The device of claim 1, wherein the tunnel junction layer has a thickness between 0.5 nm and 5 nm.

6. The device of claim 1, wherein the bipolar selector comprises:
a bottom contact layer;
a first interlayer interposed between the bottom contact layer and the tunnel junction layer; and
a top contact layer.

7. The device of claim 6, wherein the first interlayer comprises an oxide.

8. The device of claim 7, wherein the bottom contact layer comprises a first material, and wherein the first interlayer is an oxide of the first material.

9. The device of claim 6, further comprising:
a second interlayer interposed between the top contact layer and the tunnel junction layer.

10. A device comprising: a first memory cell, the first memory cell comprising: a bottom electrode disposed at a bottom of a pillar, a magnetic tunnel junction disposed over the bottom electrode, the magnetic tunnel junction disposed in the pillar, a bipolar selector electrically coupled to the magnetic tunnel junction, the bipolar selector in alignment with the magnetic tunnel junction in the pillar, the bipolar selector comprising a tunnel layer, the tunnel layer comprising MgO, and a top electrode disposed at a top of the pillar over the bipolar selector; a second memory cell connected with the first memory cell by the top electrode; a third memory cell connected with the first memory cell by the bottom electrode; and a dielectric material fill laterally surrounding the pillar.

11. The device of claim 10, wherein the bipolar selector comprises:
a bottom contact;
a first interlayer on the bottom contact,
the tunnel layer having a thickness between 0.5 nm and 5 nm on the first interlayer;
a second interlayer on the tunnel layer; and
a top contact on the second interlayer.

12. The device of claim 11, wherein the top contact and bottom contact have the same crystalline structure as the tunnel layer.

13. The device of claim 11, wherein the first interlayer and the second interlayer comprise different material compositions.

14. The device of claim 13, wherein the first interlayer and second interlayer are each between 1 nm and 5 nm thick.

15. A method comprising:
depositing a bottom electrode layer over a substrate;
depositing first film layers of a magnetic tunnel junction (MTJ) over the bottom electrode layer;
depositing second film layers of a bipolar tunnel junction over the first film layers;
depositing a top electrode layer over the second film layers;
etching the top electrode layer to form a top electrode;
etching the second film layers to form a bipolar selector;
etching the first film layers to form a MTJ structure, wherein the top electrode, the bipolar selector, and the MTJ structure are aligned in a vertical pillar; and
depositing a gap-fill material laterally surrounding the vertical pillar.

16. The method of claim 15, wherein depositing the second film layers comprises:
depositing a bottom contact layer;
depositing a tunnel junction layer; and
depositing a top contact layer.

17. The method of claim 16, further comprising:
annealing the second film layers, the annealing causing a crystallinity of the bottom contact layer and a crystallinity of the top contact layer to align to a crystallinity of the tunnel junction layer.

18. The method of claim 16, wherein depositing the second film layers further comprises:
forming a first interlayer interposed between the bottom contact layer and the tunnel junction layer; and
forming a second interlayer interposed between the top contact layer and the tunnel junction layer, the first interlayer comprising an oxide.

19. The method of claim 18, wherein forming the first interlayer comprises:
depositing a first material and oxidizing the first material by introducing oxygen to the first interlayer,
depositing the first material and oxidizing the first material by scavenging oxygen atoms from the tunnel junction layer, or
scavenging oxygen from the tunnel junction layer to oxidize a portion of the bottom contact layer.

20. The method of claim 15, wherein etching the first film layers to form the MTJ structure is performed prior to depositing the second film layers, further comprising:
- prior to depositing the second film layers, depositing a first dielectric capping layer over the MTJ structure; and
- after depositing the second film layers, depositing a second dielectric capping layer over the second film layers.

* * * * *